United States Patent
Song et al.

(10) Patent No.: US 10,396,093 B2
(45) Date of Patent: Aug. 27, 2019

(54) THREE-DIMENSIONAL SEMICONDUCTOR MEMORY DEVICE AND METHOD OF OPERATING THE SAME

(71) Applicant: Samsung Electronics Co., Ltd., Suwon-si, Gyeonggi-do (KR)

(72) Inventors: Minyeong Song, Seoul (KR); Chadong Yeo, Suwon-si (KR); Jaeduk Lee, Seongnam-si (KR); Jaehoon Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/714,254

(22) Filed: Sep. 25, 2017

(65) Prior Publication Data
US 2018/0240808 A1    Aug. 23, 2018

(30) Foreign Application Priority Data
Feb. 21, 2017 (KR) .................. 10-2017-0023110

(51) Int. Cl.
| | |
|---|---|
| *H01L 27/11582* | (2017.01) |
| *H01L 27/11565* | (2017.01) |
| *G11C 16/12* | (2006.01) |
| *H01L 27/1157* | (2017.01) |
| *G11C 16/04* | (2006.01) |
| *G11C 16/10* | (2006.01) |

(52) U.S. Cl.
CPC ........ *H01L 27/11582* (2013.01); *G11C 16/12* (2013.01); *H01L 27/1157* (2013.01); *H01L 27/11565* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | |
|---|---|---|
| 7,539,056 B2 | 5/2009 | Katsumata et al. |
| 8,537,615 B2 | 9/2013 | Maeda |
| 8,588,001 B2 | 11/2013 | Sim et al. |
| 8,614,917 B2 | 12/2013 | Shim et al. |
| 8,953,376 B2 | 2/2015 | Nam et al. |

(Continued)

FOREIGN PATENT DOCUMENTS

| | | |
|---|---|---|
| JP | 2008-192708 A | 8/2008 |
| KR | 10-2012-0100247 A | 9/2012 |
| KR | 10-1609793 B1 | 4/2016 |

*Primary Examiner* — Hrayr A Sayadian
(74) *Attorney, Agent, or Firm* — Harness, Dickey & Pierce, P.L.C.

(57) ABSTRACT

A three-dimensional (3D) semiconductor memory device includes an electrode structure including a plurality of cell electrodes vertically stacked on a substrate and extending in a first direction, lower and upper string selection electrodes sequentially stacked on the electrode structure, a first vertical structure penetrating the lower and upper string selection electrodes and the electrode structure, a second vertical structure spaced apart from the upper string selection electrode and penetrating the lower string selection electrode and the electrode structure, and a first bit line intersecting the electrode structure and extending in a second direction different from the first direction. The first bit line is connected in common to the first and second vertical structures. The second vertical structure does not extend through the upper string selection electrode.

11 Claims, 28 Drawing Sheets

(56) References Cited

U.S. PATENT DOCUMENTS 9,099,202 B2  8/2015  Mihnea et al.
9,111,617 B2  8/2015  Shim et al.
9,406,693 B1  8/2016  Pang et al.

|      | CS1  | CS2  |
|------|------|------|
| SST1 | Vth1 | Vth1 |
| SST2 | Vth2 |      |

|      | CS1  | CS2  |
|------|------|------|
| SST1 | Vth1 | Vth2 |
| SST2 | Vth2 |      |

FIG. 11

|     |       | CS1 | CS2 | CS1 & CS2 |
|-----|-------|-----|-----|-----------|
| BL  | SEL   | VSS | VSS | VSS |
|     | UNSEL | VBL | VBL | VBL |
| USSL | SEL  | V1  | V2  | V1 |
|     | UNSEL | V2  | V2  | V2 |
| LSSL | SEL  | V2  | V1  | V1 |
|     | UNSEL | V2  | V2  | V2 |

| SEL BL | | SEL USSL | |
|---|---|---|---|
| | | V1 | V2 |
| SEL LSSL | V1 | CS1 & CS2 | CS2 |
| | V2 | CS1 | – |

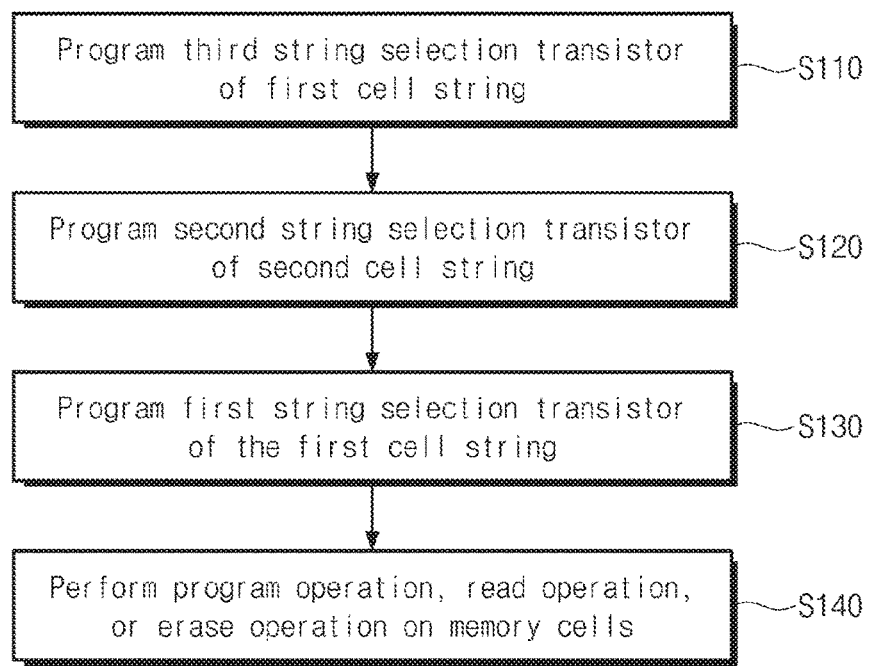

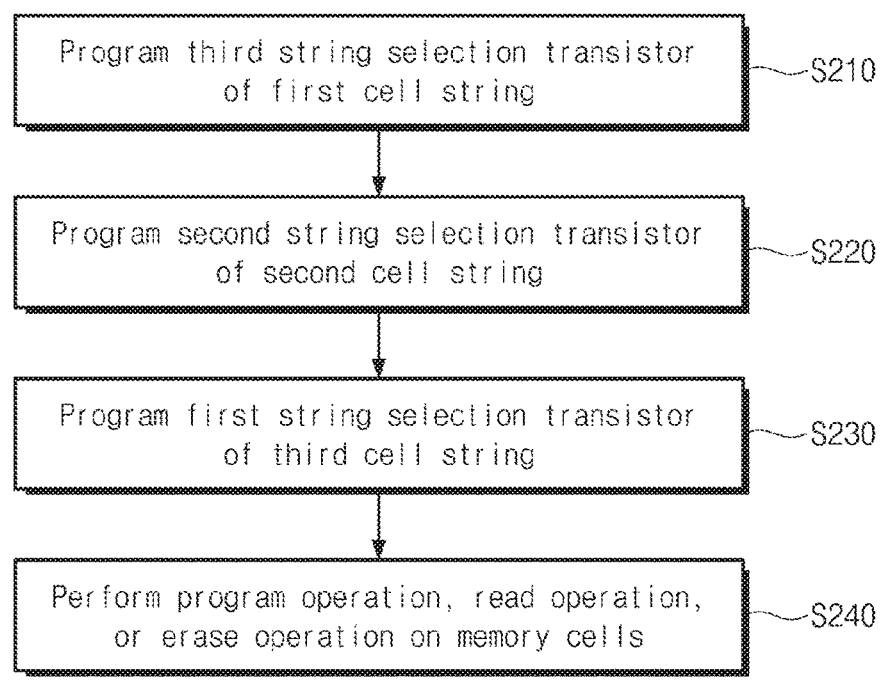

THREE-DIMENSIONAL SEMICONDUCTOR MEMORY DEVICE AND METHOD OF OPERATING THE SAME

CROSS-REFERENCE TO RELATED APPLICATION

This U.S. non-provisional patent application claims priority under 35 U.S.C. § 119 to Korean Patent Application No. 10-2017-0023110, filed on Feb. 21, 2017, in the Korean Intellectual Property Office, the disclosure of which is hereby incorporated by reference in its entirety.

BACKGROUND

Inventive concepts relate to a three-dimensional (3D) semiconductor memory device and a method of operating the same and, more particularly, to a 3D semiconductor memory device with improved integration density and reliability and a method of operating the same.

Semiconductor devices have been highly integrated to provide excellent performance and lower manufacturing costs. The integration density of semiconductor devices directly affects the costs of the semiconductor devices, thereby resulting in a demand of highly integrated semiconductor devices. Thus, three-dimensional (3D) semiconductor memory devices have been developed. The 3D semiconductor memory device may include memory cells three-dimensionally arranged.

SUMMARY

Inventive concepts may provide a three-dimensional (3D) semiconductor memory device capable of improving an integration density and a method of operating the same.

According to some example embodiments of inventive concepts, a three-dimensional (3D) semiconductor memory device may include a substrate, an electrode structure extending in a first direction on the substrate and including a plurality of cell electrodes vertically stacked on the substrate, a lower string selection electrode and an upper string selection electrode sequentially stacked on the electrode structure, a first vertical structure penetrating the lower string selection electrodes and the upper string selection electrodes and the electrode structure, a second vertical structure spaced apart from the upper string selection electrode such that the second vertical structure does not extend through the upper string selection electrode and the second vertical structure penetrates the lower string selection electrode and the electrode structure, and a first bit line extending in a second direction different from the first direction. The first bit line may be connected in common to the first vertical structure and the second vertical structure.

According to some example embodiments of inventive concepts, a 3D semiconductor memory device may include a substrate, a first cell string on the substrate and arranged vertical to a top surface of a substrate, a second cell string on the substrate and arranged vertical to the top surface of the substrate, and a bit line connected in common to the first cell string and the second cell string. The first cell string may include m string selection transistors connected in series. The second cell string may include n string selection transistor(s) connected in series. The "n" may be a natural number, and the "m" may be a natural number greater than the "n". Both "m" and "n" are greater than 0.

According to some example embodiments of inventive concepts, a method of operating a 3D semiconductor memory device may be provided. The 3D semiconductor memory device may include a bit line connected in common to a first cell string and a second cell string. The first cell string may include a plurality of first memory cells and a first string selection transistor and a second string selection transistor connected in series to each other. The second cell string may include a plurality of second memory cells and a third string selection transistor. The method may include programming the second string selection transistor of the first cell string such that a threshold voltage of the second string selection transistor is greater than a threshold voltage of the first string selection transistor and a threshold voltage of the third string selection transistor, and programming the third string selection transistor of the second cell string after the programming the second string selection transistor such that a threshold voltage of the third string selection transistor is greater than the threshold voltage of the first string selection transistor of the first cell string.

According to some example embodiments of inventive concepts, a three-dimensional (3D) semiconductor memory device may include a substrate, a plurality of cell strings on the substrate and extending vertical to a top surface of the substrate, a lower string selection line, and an upper string selection line. Each of the plurality of cell strings may include a ground selection transistor, a plurality of memory cells stacked on top of each other on the ground selection transistor, and the first string selection transistor on the plurality of memory cells. The plurality of cell strings may include a first cell string and a second cell string that respectively have a different number of string selection transistors compared to each other. The first cell string may include a top string selection transistor on the first string selection transistor of the first cell string. The lower string selection line may be connected in common to a gate of the first string selection transistor of the first cell string and a gate at the first string selection transistor of the second cell string. The upper string selection line may be connected to a gate of the top string selection transistor of the first cell string.

BRIEF DESCRIPTION OF THE DRAWINGS

Inventive concepts will become more apparent in view of the attached drawings and accompanying detailed description.

FIG. 11 is a table illustrating voltage conditions for selecting cell strings in a third operation S30 of FIG. 6.

FIG. 22 is a flow chart illustrating a method of operating the 3D semiconductor memory device of FIGS. 18 to 21.

FIG. 23 is a table illustrating threshold voltages of string selection transistors in the cell array of the 3D semiconductor memory device illustrated in FIGS. 17 to 21.

FIG. 32 is a flow chart illustrating a method of operating the 3D semiconductor memory device of FIGS. 28 to 31.

FIG. 33 is a table illustrating threshold voltages of string selection transistors in the cell array of the 3D semiconductor memory device illustrated in FIGS. 28 to 31.

DETAILED DESCRIPTION 3D semiconductor memory devices and methods of operating the same according to some example embodiments of inventive concepts will be described more fully hereinafter with reference to the accompanying drawings.

Figure 1:
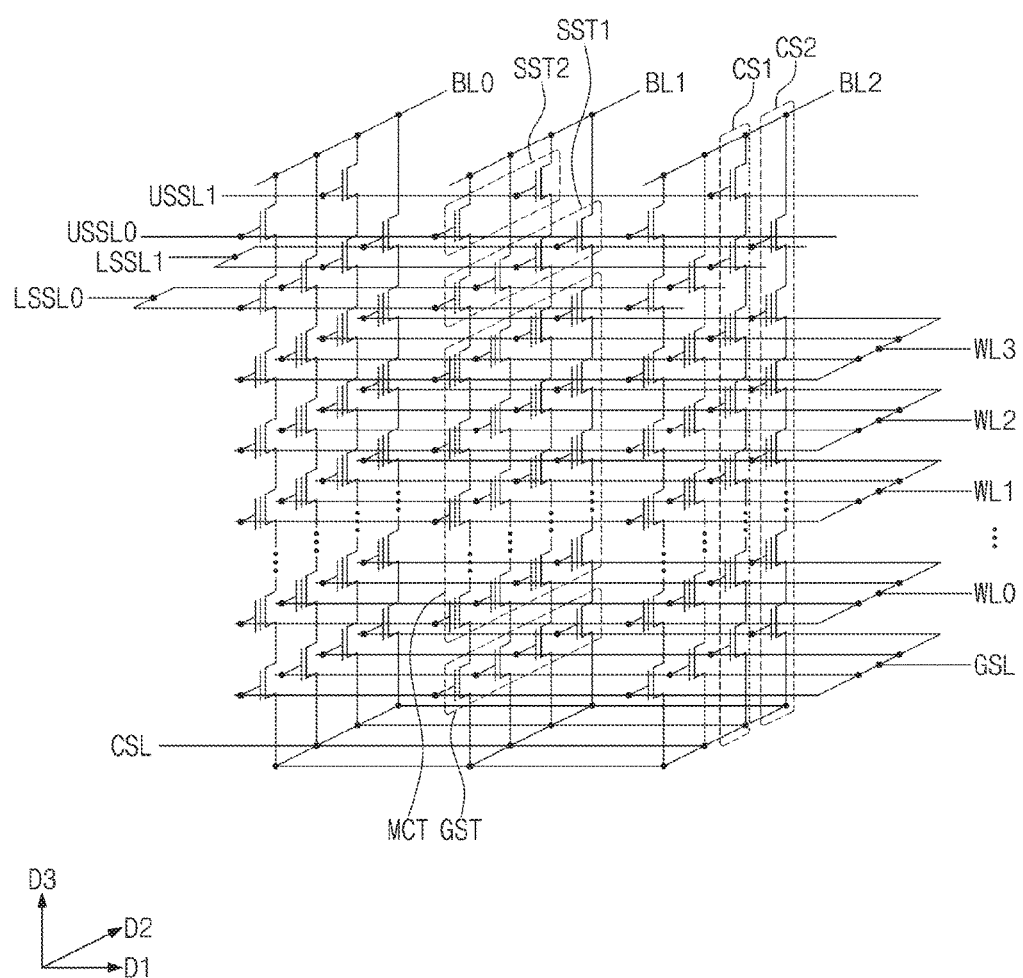
FIG. 1 is a circuit diagram illustrating a cell array of a three-dimensional (3D) semiconductor memory device according to some example embodiments of inventive concepts.

FIG. 1 is a circuit diagram illustrating a cell array of a three-dimensional (3D) semiconductor memory device according to some example embodiments of inventive concepts.

Referring to FIG. 1, a cell array of a 3D semiconductor memory device according to some example embodiments may include common source lines CSL, a plurality of bit lines BL0 to BL2, and a plurality of cell strings CS1 and CS2 disposed between the common source lines CSL and the bit lines BL0 to BL2. The plurality of cell strings CS1 and CS2 may include first cell strings CS1 and second cell strings CS2.

The bit lines BL0 to BL2 may be two-dimensionally arranged. A plurality of the first cell strings CS1 and a plurality of the second cell strings CS2 may be connected in parallel to each of the bit lines BL0 and BL2. The first and second cell strings CS1 and CS2 may be connected to the common source lines CSL. The common source lines CSL may be electrically connected to each other.

In some example embodiments, each of the first and second cell strings CS1 and CS2 may include a ground selection transistor GST connected to the common source line CSL, string selection transistors SST1 and SST2 (or SST1 instead of both SST1 and SST2) connected to one of the bit lines BL0 to BL2, and a plurality of memory cell transistors MCT disposed between the ground selection transistor GST and the string selection transistor SST1. The ground selection transistor GST, the memory cell transistors MCT, and the string selection transistors SST1 and SST2 (or SST1) may be connected in series to each other in the order named.

Ground selection lines GSL, a plurality of word lines WL0 to WL3, lower string selection lines LSSL0 and LSSL1, and upper string selection lines USSL0 and USSL1, which are disposed between the common source lines CSL and the bit lines BL0 to BL2, may be used as gate electrodes of the ground selection transistors GST, gate electrodes of the memory cell transistors MCT, and gate electrodes of the string selection transistors SST1 and SST2, respectively.

The lower and upper string selection lines LSSL0, LSSL1, USSL0, and USSL1 may control electrical connection between the bit lines BL0 to BL2 and the first and second cell strings CS1 and CS2, and the ground selection lines GSL may control electrical connection between the common source lines CSL and the first and second cell strings CS1 and CS2. The ground selection lines GSL may be electrically connected to each other. The plurality of word lines WL0 to WL3 may control the memory cell transistors MCT. Each of the memory cell transistors MCT may include a data storage element.

In some example embodiments, each of the first cell strings CS1 may include m string selection transistors SST1 and SST2, and each of the second cell strings CS2 may include n string selection transistor(s) SST1. Here, "n" is a natural number, and "m" is a natural number greater than "n".

In more detail, each of the first cell strings CS1 may include first and second string selection transistors SST1 and SST2 connected in series to each other. The first string selection transistor SST1 may be connected to the memory cell transistor MCT, and the second string selection transistor SST2 may be connected to the one of the bit lines BL0 to BL2. The ground selection transistor GST may be connected to the common source line CSL. The memory cell transistors MCT may be connected in series between the first string selection transistor SST1 and the ground selection transistor GST. The second string selection transistor SST2 may be referred to as a top string selection transistor.

In each of the first cell strings CS1, the first and second string selection transistors SST1 and SST2 may have threshold voltages different from each other. In some example embodiments, the first string selection transistor SST1 may have a first threshold voltage, and the second string selection transistor SST2 may have a second threshold voltage greater than the first threshold voltage. Here, the first and second string selection transistors SST1 and SST2 may be turned on by a first operating voltage greater than the first and second threshold voltages. In addition, the first string selection transistor SST1 may be turned on by a second operating voltage less than the first operating voltage, but the second string selection transistor SST2 may be turned off by the second operating voltage. In other words, the second operating voltage may be greater than the first threshold voltage and less than the second threshold voltage.

For example, the first and second string selection transistors SST1 and SST2 of the first cell string CS1 may include at least one enhancement-mode field effect transistor and at least one depletion-mode field effect transistor. In other words, the first string selection transistor SST1 may be the depletion-mode field effect transistor, and the second string selection transistor SST2 may be the enhancement-mode field effect transistor.

Each of the second cell strings CS2 may include a first string selection transistor SST1 connected to one of the bit lines BL0 to BL2, the ground selection transistor GST connected to the common source line CSL, and the plurality of memory cell transistors MCT connected in series between the first string selection transistor SST1 and the ground selection transistor GST.

The first string selection transistor SST1 of the second cell string CS2 may have a greater threshold voltage than the first string selection transistor SST1 of the first cell string CS1. In some example embodiments, the first string selection transistor SST1 of the second cell string CS2 may include at least one enhancement-mode field effect transistor. According to some example embodiments, all of the first string selection transistors SST1 of the first and second cell strings CS1 and CS2 may be turned on by the first operating voltage. On the other hand, the first string selection transistor SST1 of the first cell string CS1 may be turned on by the second operating voltage less than the first operating voltage, but the first string selection transistor SST1 of the second cell string CS2 may be turned off by the second operating voltage.

The first cell strings CS1 and the second cell strings CS2 may be alternately connected to each of the bit lines BL0 to BL2 along the second direction D2. At this time, a pair of first and second cell strings CS1 and CS2 which are adjacent to each other and are connected to each of the bit lines BL0 to BL2 may be defined as a cell string group. In other words, a plurality of the cell string groups may be connected to each of the bit lines BL0 to BL2. In some example embodiments, gate electrodes of the first string selection transistors SST1 of the pair of first and second cell strings CS1 and CS2 corresponding to the cell string group may be connected in common to one lower string selection line LSSL0 or LSSL1. A gate electrode of the second string selection transistor SST2 of the first cell string CS1 of the pair of first and second cell strings CS1 and CS2 may be connected to one upper string selection line USSL0 or USSL1. In some example embodiments, the electrical connection between the first cell string CS1 and a corresponding one of the bit lines BL0 to BL2 may be controlled according to a voltage applied to the upper string selection line USSL0 or USSL1. The electrical connection between the second cell string CS2 and a corresponding one of the bit lines BL0 to BL2 may be controlled according to a voltage applied to the lower string selection line LSSL0 or LSSL1. A plurality of the cell string groups may be connected to each of the lower string selection lines LSSL0 and LSSL1 and each of the upper string selection lines USSL0 and USSL1. The upper string selection lines USSL0 and USSL1 may be electrically controlled independently of each other, and the lower string selection lines LSSL0 and LSSL1 may be electrically controlled independently of each other.

Figure 2:
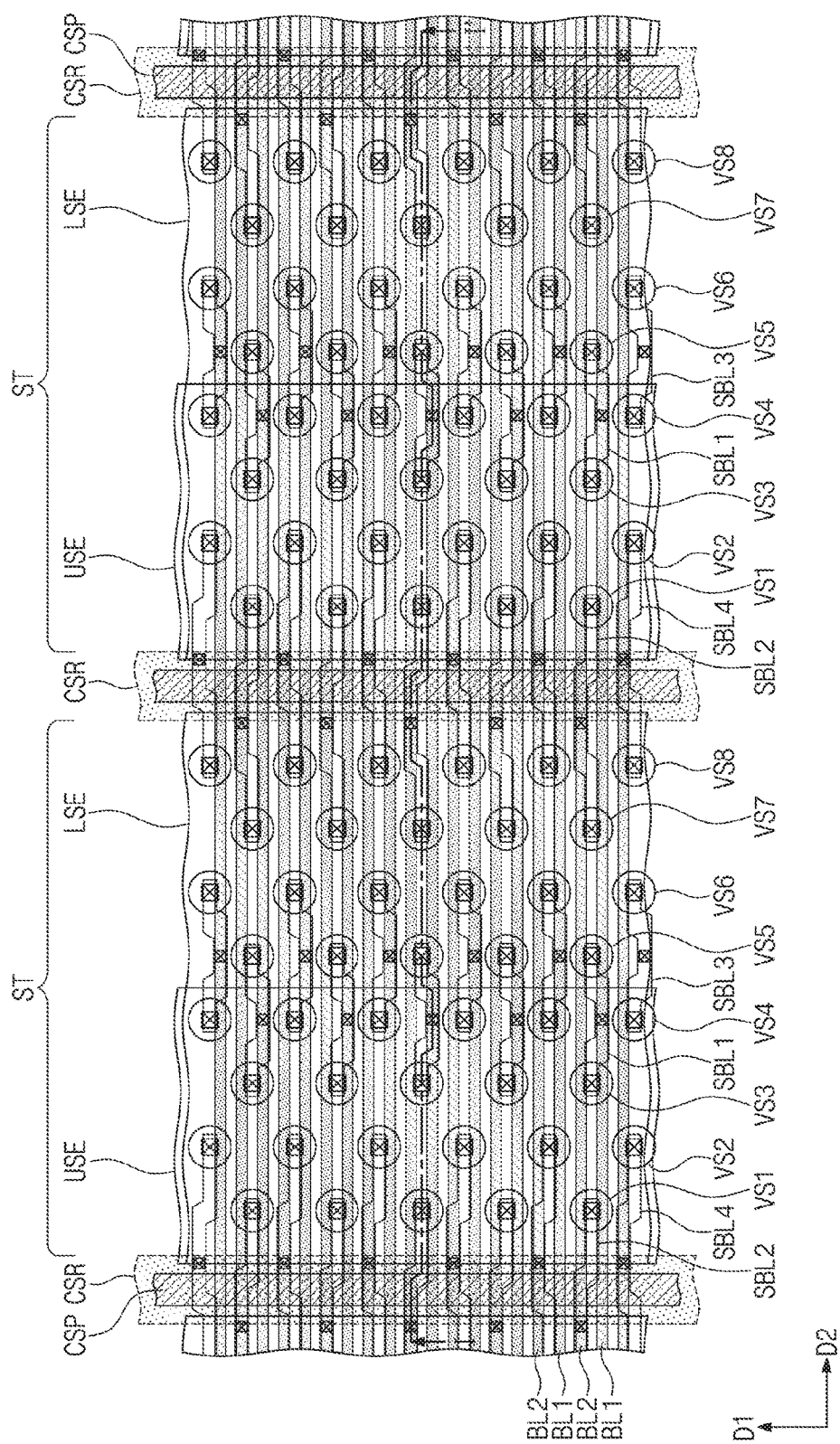
FIG. 2 is a plan view illustrating a cell array of a 3D semiconductor memory device according to some example embodiments of inventive concepts.
Figure 3:
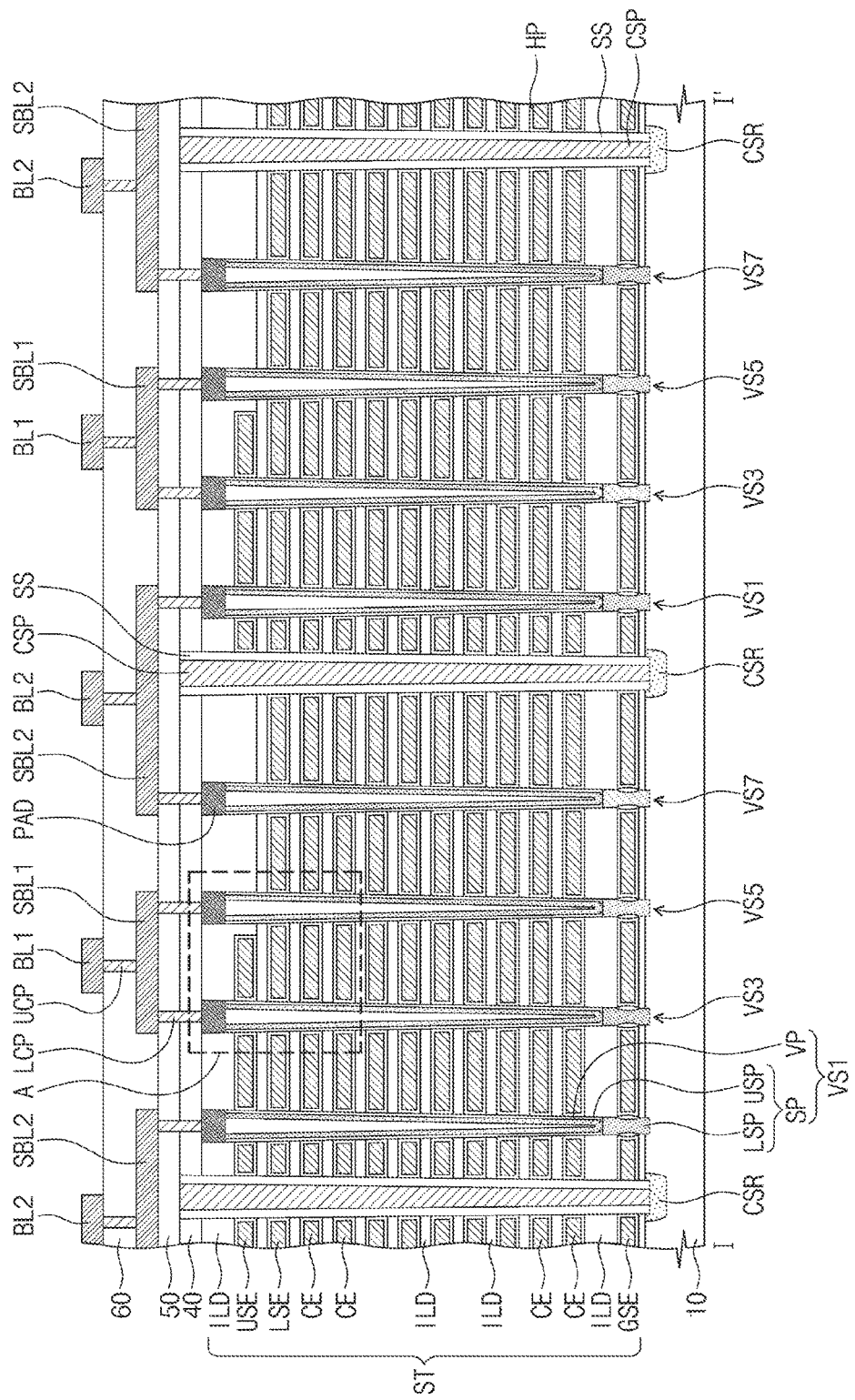
FIG. 3 is a cross-sectional view taken along a line I-I' of FIG. 2.
Figure 4:
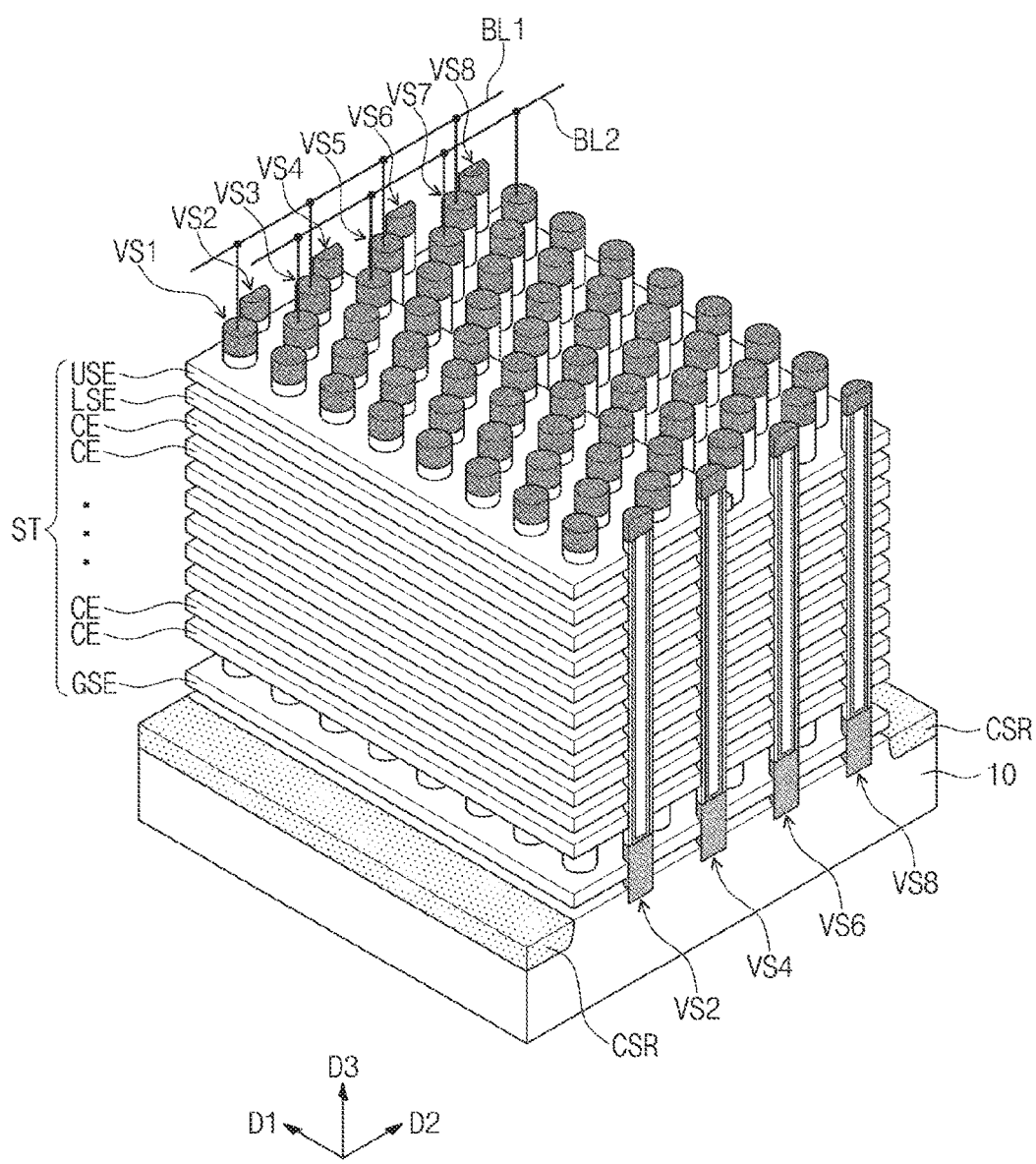
FIG. 4 is a schematic perspective view illustrating the cell array of the 3D semiconductor memory device of FIGS. 2 and 3.
Figure 5:
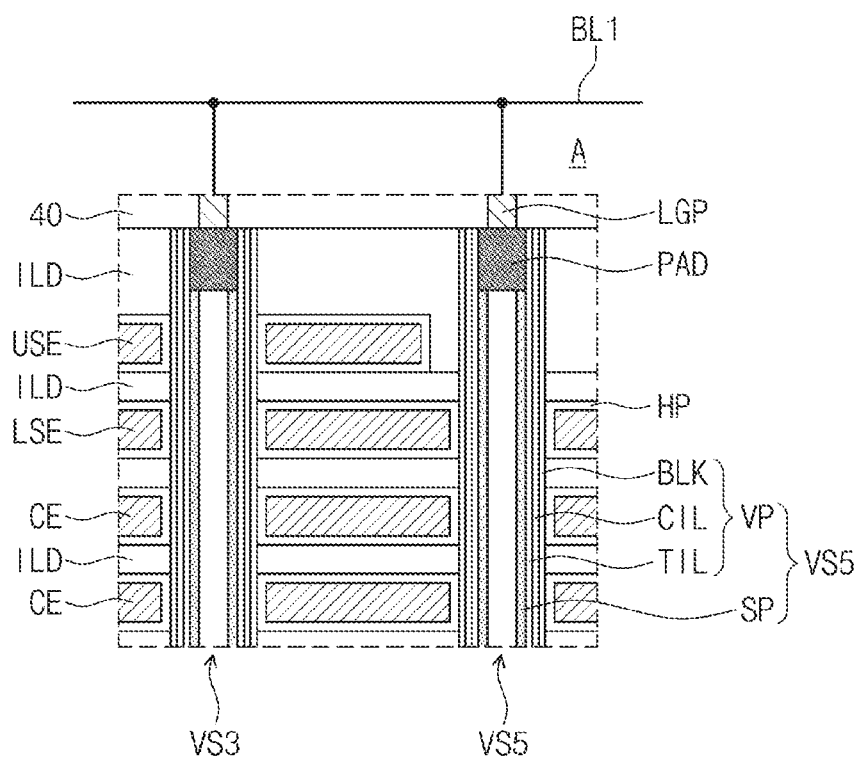
FIG. 5 is an enlarged view of a portion 'A' of FIG. 3.

FIG. 2 is a plan view illustrating a cell array of a 3D semiconductor memory device according to some example embodiments of inventive concepts. FIG. 3 is a cross-sectional view taken along a line I-I' of FIG. 2. FIG. 4 is a schematic perspective view illustrating the cell array of the 3D semiconductor memory device of FIGS. 2 and 3. FIG. 5 is an enlarged view of a portion 'A' of FIG. 3.

Referring to FIGS. 2, 3, and 4, electrode structures ST may be disposed on a substrate 10. The electrode structures ST may extend in a first direction D1 parallel to a top surface of the substrate 10 and may be spaced apart from each other in a second direction D2. The second direction D2 may be parallel to the top surface of the substrate 10 and may be perpendicular to the first direction D1.

The substrate 10 may include a material having a semiconductor characteristic (e.g., a silicon wafer), an insulating material (e.g., a glass substrate), or a semiconductor or conductor covered with an insulating material. For example, the substrate 10 may be a silicon wafer having a first conductivity type.

Each of the electrode structures ST may include a plurality of electrodes GSE, CE, LSE, and USE stacked along a third direction D3 perpendicular to the first and second directions D1 and D2. In other words, the plurality of electrodes GSE, CE, LSE, and USE may be vertically stacked on the substrate 10. Each of the electrode structures ST may further include insulating layers ILD disposed between the electrodes GSE, CE, LSE, and USE. That is, the insulating layers ILD and the electrodes GSE, CE, LSE, and USE may be alternately stacked on the substrate 10.

In some example embodiments, the electrodes GSE, CE, LSE, and USE may include a ground selection electrode GSE, a plurality of cell electrodes CE, a lower selection electrode LSE, and an upper selection electrode USE. The ground selection electrode GSE may be adjacent to the substrate 10, and the cell electrodes CE may be sequentially stacked on the ground selection electrode GSE. The lower selection electrode LSE and the upper selection electrode USE may be sequentially stacked on the uppermost one of the cell electrodes CE.

In some example embodiments, in each of the electrode structures ST, the ground selection electrode GSE and the cell electrodes CE may have a first width in the second direction D2 and the lower selection electrode LSE may have a second width in the second direction D2. The second width may be substantially equal to the first width. The upper selection electrode USE may have a third width smaller than the second width in the second direction D2.

Each of common source regions CSR may be provided in the substrate 10 between the electrode structures ST adjacent to each other. The common source regions CSR may extend in parallel to the electrode structures ST in the first direction D1 and may be spaced apart from each other in the second direction D2. In other words, each of the electrode structures ST may be disposed on the substrate 10 between the common source regions CSR adjacent to each other. In some example embodiments, the common source regions CSR may be formed by doping portions of the substrate 10 having the first conductivity type with dopants of a second conductivity type different from the first conductivity type. For example, the common source regions CSR may include N-type dopants (e.g., arsenic (As) or phosphorus (P)).

A common source plug CSP may be connected to the common source region CSR between the electrode structures ST, and sidewall insulating spacers SS may be disposed between the common source plug CSP and sidewalls of the electrode structures ST. In some example embodiments, the common source plug CSP may have a substantially uniform upper width and may extend in the first direction D1.

In some example embodiments, first to eighth vertical structures VS1 to VS8 may penetrate each of the electrode structures ST so as to be connected to the substrate 10. In other words, the first to eighth vertical structures VS1 to VS8 may extend in the third direction D3 perpendicular to the top surface of the substrate 10. Each of the first to eighth vertical structures VS1 to VS8 may be provided in plurality to constitute a column along the first direction D1. In addition, the first to eighth vertical structures VS1 to VS8 may be arranged in a zigzag form along the second direction D2 when viewed in a plan view.

In more detail, horizontal distances (distances in the second direction D2) of the first to eighth vertical structures VS1 to VS8 from the common source region CSR may increase in the order listed. In other words, the first vertical structures VS1 may be arranged in the first direction D1 to constitute a first column, the second vertical structures VS2 may be arranged in the first direction D1 to constitute a second column, the third vertical structures VS3 may be arranged in the first direction D1 to constitute a third column, and the fourth vertical structures VS4 may be arranged in the first direction D1 to constitute a fourth column. The first and third vertical structures VS1 and VS3 may be spaced apart from the second and fourth vertical structures VS2 and VS4 in a diagonal direction, respectively.

Likewise, the fifth vertical structures VS5 may be arranged in the first direction D1 to constitute a fifth column, the sixth vertical structures VS6 may be arranged in the first direction D1 to constitute a sixth column, the seventh vertical structures VS7 may be arranged in the first direction D1 to constitute a seventh column, and the eighth vertical structures VS8 may be arranged in the first direction D1 to constitute an eighth column. The fifth and seventh vertical structures VS5 and VS7 may be spaced apart from the sixth and eighth vertical structures VS6 and VS8 in the diagonal direction, respectively.

In some example embodiments, the first to fourth vertical structures VS1 to VS4 may penetrate the upper selection electrode USE and the lower selection electrode LSE of each of the electrode structures ST. The fifth to eighth vertical structures VS5 to VS8 may be spaced apart from the upper selection electrode USE and may penetrate the lower selection electrode LSE of each of the electrode structures ST. The fifth to eighth vertical structures VS5 to VS8 may be arranged so they do not penetrate the upper selection electrode USE.

In some example embodiments, each of the first to eighth vertical structures VS1 to VS8 may include a vertical semiconductor pattern SP and a vertical insulating pattern VP surrounding the vertical semiconductor pattern SP. The vertical semiconductor pattern SP may be electrically connected to a well dopant layer (not shown) which is provided in the substrate 10 and has the first conductivity type.

The vertical semiconductor pattern SP may include a semiconductor material and may be used as channel regions of the ground selection transistor GST, the string selection transistors SST1 and SST2 and the memory cell transistors MCT described with reference to FIG. 1.

In some example embodiments, the vertical semiconductor pattern SP may include a lower semiconductor pattern LSP and an upper semiconductor pattern USP. The lower semiconductor pattern LSP may penetrate a lower portion of the electrode structure ST so as to be in contact with the substrate 10. In some example embodiments, the lower semiconductor pattern LSP may have a pillar shape which penetrates the ground selection electrode GSE corresponding to the lowermost layer of the electrode structure ST. The lower semiconductor pattern LSP may be formed of a semiconductor material having the same conductivity type as the substrate 10. For example, the lower semiconductor pattern LSP may include an epitaxial pattern formed by a selective epitaxial growth (SEG) method using the substrate 10 as a seed. A thermal oxide layer may be formed between the lower semiconductor pattern LSP and the ground selection electrode GSE.

The upper semiconductor pattern USP may penetrate an upper portion of the electrode structure ST so as to be in contact with the lower semiconductor pattern LSP. The upper semiconductor pattern USP may have a hollow pipe or macaroni shape of which a bottom end is closed. An inner space of the upper semiconductor pattern USP may be filled with an insulating material. The upper semiconductor pattern USP may be undoped or may be doped with dopants having the same conductivity type as the substrate 10.

Each of the first to eighth vertical structures VS1 to VS8 may include a conductive pad PAD disposed on a top end of the vertical semiconductor pattern SP. The conductive pad PAD may be a dopant region doped with dopants or may be formed of a conductive material.

In some example embodiments, the vertical insulating pattern VP may surround a sidewall of a vertical semiconductor pattern SP. The vertical insulating pattern VP may include a charge storage layer that stores data in an NAND flash memory device.

For example, as illustrated in FIG. 5, the vertical insulating pattern VP may include a tunnel insulating layer TIL, a charge storage layer CIL, and a blocking insulating layer BLK, which constitute a data storage layer in the NAND flash memory device. Date stored in the data storage layer may be changed by a Fowler-Nordheim (FN) tunneling effect caused by voltage differences between the vertical semiconductor pattern SP including the semiconductor material and the electrodes GSE, CE, LSE, and USE.

The charge storage layer CIL may include at least one of a trap site-rich insulating layer or an insulating layer including nanoparticles. For example, the charge storage layer CIL may include at least one of a trap insulating layer, a floating gate electrode, or an insulating layer including conductive nano dots. For example, the charge storage layer CIL may include at least one of a silicon nitride layer, a silicon oxynitride layer, a silicon-rich nitride layer, a nano-crystalline silicon layer, or a laminated trap layer. The tunnel insulating layer TIL may include a material of which an energy band gap is greater than that of the charge storage layer CIL. For example, the tunnel insulating layer TIL may include a silicon oxide layer. Alternatively, the tunnel insulating layer TIL may include at least one of high-k dielectric layers such as an aluminum oxide layer and a hafnium oxide layer. The blocking insulating layer BLK may include a material of which an energy band gap is less than that of the tunnel insulating layer TIL and greater than that of the charge storage layer CIL. For example, the blocking insulating layer BLK may include a high-k dielectric layer such as an aluminum oxide layer and/or a hafnium oxide layer. In certain embodiments, the blocking insulating layer BLK may include a material having a greater energy band gap than the charge storage layer CIL. For example, the blocking insulating layer BLK may include a silicon oxide layer.

In some example embodiments, the vertical insulating pattern VP may extend in the third direction D3 perpendicular to the top surface of the substrate 10. In other words, the vertical insulating pattern VP may vertically extend from between each of the vertical structures VS1 to VS8 and the cell electrodes CE into between each of the vertical structures VS1 and VS8 and the lower and upper selection electrodes LSE and USE, as illustrated in FIG. 5. That is, the data storage layer including the charge storage layer CIL may be used as gate insulating layers of the first and second string selection transistors SST1 and SST2 described with reference to FIG. 1.

In addition, a horizontal insulating pattern HP may extend from between the vertical insulating pattern VP and a sidewall of each of the electrodes GSE, CE, LSE, and USE onto top and bottom surfaces of each of the electrodes GSE, CE, LSE, and USE. The horizontal insulating pattern HP may correspond to a portion of the data storage layer of the NAND flash memory device. For example, the horizontal insulating pattern HP may include a high-k dielectric layer such as an aluminum oxide layer and/or a hafnium oxide layer. The horizontal insulating pattern HP may have a lower dielectric constant than the blocking insulating layer BLK or may have a higher dielectric constant than the blocking insulating layer BLK.

A capping insulating pattern 40 may be disposed on each of the electrode structures ST and may cover top surfaces of the conductive pads PAD of the first to eighth vertical structures VS1 to VS8. A first interlayer insulating layer 50 may be disposed on the capping insulating patterns 40 and may cover top surfaces of the common source plugs CSP.

Auxiliary interconnection lines SBL1, SBL2, SBL3, and SBL4 may be disposed on the first interlayer insulating layer 50, and each of the auxiliary interconnection lines SBL1, SBL2, SBL3, and SBL4 may electrically connect adjacent vertical structures to each other through lower contact plugs LCP.

For example, the auxiliary interconnection lines may include first to fourth auxiliary interconnection lines SBL1 to SBL4. The first to fourth auxiliary interconnection lines SBL1 to SBL4 may have long axes in the second direction D2, and the second and fourth auxiliary interconnection lines SBL2 and SBL4 may intersect the common source region CSR.

The first auxiliary interconnection line SBL1 may electrically connect the third vertical structure VS3 penetrating the upper and lower selection electrodes USE and LSE to the fifth vertical structure VS5 which is spaced apart from the upper selection electrode USE and penetrates the lower selection electrode LSE. The second auxiliary interconnection line SBL2 may electrically connect the first vertical structure VS1 penetrating the upper and lower selection electrodes USE and LSE to the seventh vertical structure VS7 which is spaced apart from the upper selection electrode USE and penetrates the lower selection electrode LSE. Here, the first vertical structure VS1 connected to the second auxiliary interconnection line SBL2 may penetrate one of adjacent electrode structures ST, and the seventh vertical structure VS7 connected to the second auxiliary interconnection line SBL2 may penetrate the other of the adjacent electrode structures ST.

The third auxiliary interconnection line SBL3 may electrically connect the fourth vertical structure VS4 penetrating the upper and lower selection electrodes USE and LSE to the sixth vertical structure VS6 which is spaced apart from the upper selection electrode USE and penetrates the lower selection electrode LSE. The fourth auxiliary interconnection line SBL4 may electrically connect the second vertical structure VS2 penetrating the upper and lower selection electrodes USE and LSE to the eighth vertical structure VS8 which is spaced apart from the upper selection electrode USE and penetrates the lower selection electrode LSE. Here, the second vertical structure VS2 connected to the fourth auxiliary interconnection line SBL4 may penetrate one of adjacent electrode structures ST, and the eighth vertical structure VS8 connected to the fourth auxiliary interconnection line SBL4 may penetrate the other of the adjacent electrode structures ST.

A second interlayer insulating layer 60 may be disposed on the first interlayer insulating layer 50 and the first to fourth auxiliary interconnection lines SBL1 to SBL4.

First and second bit lines BL1 and BL2 may be disposed on the second interlayer insulating layer 60. The first and second bit lines BL1 and BL2 may extend in the second direction D2 to intersect the electrode structures ST and may be alternately arranged in the first direction D1. In some example embodiments, a pair of first and second bit lines BL1 and BL2 may intersect a top surface of one vertical structure when viewed in a plan view. In other words, a width of each of the first and second bit lines BL1 and BL2 may be smaller than a half of a width of the top surface of each of the vertical structures VS1 to VS8.

Each of the first bit lines BL1 may be electrically connected to the first or third auxiliary interconnection lines SBL1 or SBL3 through upper contact plugs UCP, and each of the second bit lines BL2 may be electrically connected to the second or fourth auxiliary interconnection lines SBL2 or SBL4 through upper contact plugs UCP.

The 3D semiconductor memory device illustrated in FIGS. 2 to 5 may be the vertical NAND flash memory device described with reference to FIG. 1. In FIGS. 2 to 5, the first to fourth vertical structures VS1 to VS4 may form the first cell strings CS1 described with reference to FIG. 1, and the fifth to eighth vertical structures VS5 to VS8 may form the second cell strings CS2 described with reference to FIG. 1.

Electric potentials of the vertical semiconductor patterns SP of the first to eighth vertical structures VS1 to VS8 may be controlled by the ground selection electrode GSE, the cell electrodes CE, and the upper and lower selection electrodes USE and LSE of the electrode structure ST, and current paths between the common source region CSR and the bit lines BL1 and BL2 may be generated in the first to eighth vertical structures VS1 to VS8.

In more detail, the ground selection electrode GSE may be used as the gate electrodes of the ground selection transistors (GST of FIG. 1) controlling electrical connection between the common source region CSR and the vertical structures VS1 to VS8. The lower selection electrode LSE may be used as the gate electrodes of the first string selection transistors SST1 controlling electrical connection between the bit lines BL1 and BL2 and the first to eighth vertical structures VS1 to VS8. The upper selection electrode USE may be used as the gate electrodes of the second string selection transistors SST2 controlling electrical connection between the bit lines BL1 and BL2 and the first to fourth vertical structures VS1 to VS4. The cell electrodes CE may be used as gate electrodes controlling channel potentials of the memory cell transistors MCT.

Figure 6:
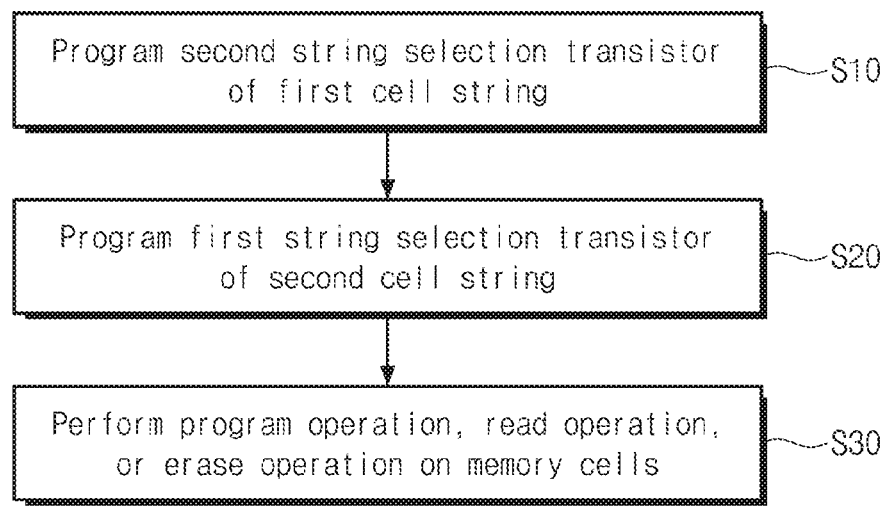
FIG. 6 is a flow chart illustrating a method of operating the 3D semiconductor memory device of FIGS. 2 to 5.

FIG. 6 is a flow chart illustrating a method of operating the 3D semiconductor memory device of FIGS. 1 to 5.

Referring to FIGS. 1 and 6, a method of operating a 3D semiconductor memory device may include a first operation S10 of programming the second string selection transistor SST2 of the first cell string CS1, a second operation S20 of programming the first string selection transistor SST1 of the second cell string CS2, and a third operation S30 of performing at least one of a program operation, a read operation, or an erase operation on the memory cell transistors MCT. Here, the first to third operations S10, S20, and S30 may be sequentially performed.

The first operation S10 may include trapping charges in the charge storage layer used as the gate insulating layer of the second string selection transistor SST2 of the first cell string CS1. Thus, a threshold voltage of the second string selection transistor SST2 may be greater than a threshold voltage of the first string selection transistor SST1. This will be described in more detail with reference to FIGS. 7 and 8.

The second operation S20 may include trapping charges in the charge storage layer used as the gate insulating layer of the first string selection transistor SST1 of the second cell string CS2. Thus, a threshold voltage of the first string selection transistor SST1 of the second cell string CS2 may be greater than the threshold voltage of the first string selection transistor SST1 of the first cell string CS1. This will be described in more detail with reference to FIGS. 9 and 10.

The third operation S30 may include performing the program operation of writing data into at least one of the three-dimensionally arranged memory cell transistors MCT and/or performing the read operation of reading data from a selected memory cell transistor MCT. In more detail, the third operation S30 may include selecting one among a plurality of the first and second cell strings CS1 and CS2, and writing or reading data into or from the memory cell transistor MCT selected from the selected cell string CS1 or CS2. In addition, the third operation S30 may include selecting all of the first and second cell strings CS1 and CS2 at the same time and erasing data from all of the memory cell transistors MCT.

In some example embodiments, after the third operation S30 is performed a plurality of times, the first and second operations S10 and S20 may be sequentially performed to maintain the threshold voltages of the first and second string selection transistors SST1 and SST2.

Figures 7, 8:
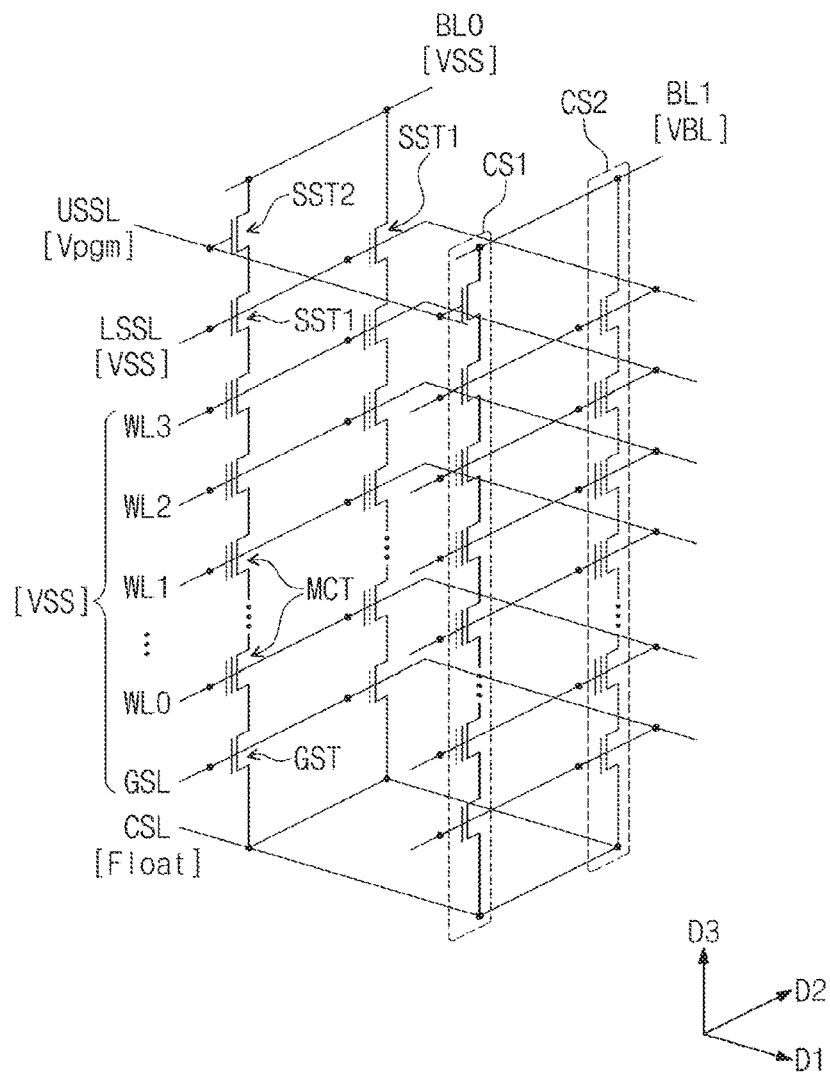
FIG. 7 is a circuit diagram illustrating voltage conditions in a first operation S10 of FIG. 6.
FIG. 8 is a table illustrating threshold voltages of string selection transistors after the first operation S10 of FIG. 6.

FIG. 7 is a circuit diagram illustrating voltage conditions in a first operation S10 of FIG. 6. FIG. 8 is a table illustrating threshold voltages of string selection transistors after the first operation S10 of FIG. 6.

Referring to FIGS. 7 and 8, a ground voltage VSS may be applied to the ground selection line GSL, the word lines WL0 to WL3 and the lower string selection line LSSL to turn off the first string selection transistors SST1, the memory cell transistors MCT and the ground selection transistors GST of the first and second cell strings CS1 and CS2.

The ground voltage VSS may be applied to a selected bit line BL0, and a desired (and/or alternatively predetermined) bit line voltage VBL may be applied to an unselected bit line BL1. A program voltage Vpgm may be applied to the upper string selection line USSL. Here, the program voltage Vpgm may be a voltage great enough to cause the FN tunneling effect from the vertical semiconductor pattern (SP of FIG. 3).

The ground voltage VSS applied to the selected bit line BL0 may be transmitted to the vertical semiconductor pattern of the first cell string CS1 connected to the selected bit line BL0 under the voltage conditions described above, and thus a great potential difference may be generated between the upper string selection line USSL supplied with the program voltage Vpgm and the vertical semiconductor pattern of the first cell string CS1 connected to the selected bit line BL0. As a result, charges may be trapped in the charge storage layer adjacent to the upper string selection line USSL. Thus, in the first cell string CS connected to the selected bit line BL0, a threshold voltage of the second string selection transistor SST2 may be increased to a second threshold voltage Vth2 greater than a first threshold voltage Vth1 of the first string selection transistor SST1. In some example embodiments, thereafter, another bit line BL1 may be selected, and the program operation described above may be performed on the second string selection transistor SST2 of the first cell string CS1 connected to the selected bit line BL1. The selection operation of the bit line and the program operation of the second string selection transistor SST2 may be repeatedly performed to increase threshold voltages of the second string selection transistors SST2 of the first cell strings CS1 connected to all of the bit lines BL0 and BL1. Alternatively, the ground voltage VSS may be applied to all of the bit lines BL0 and BL1 at the same time and the program voltage Vpgm may be applied to all of the upper string selection lines USSL at the same time, and thus the threshold voltages of the second string selection transistors SST2 of all of the first cell strings CS1 may be increased at the same time.

As a result, after the first operation S10, each of the second string selection transistors SST2 of the first cell strings CS1 connected to the bit lines BL0 and BL1 may have the second threshold voltage Vth2.

Figures 9, 10:
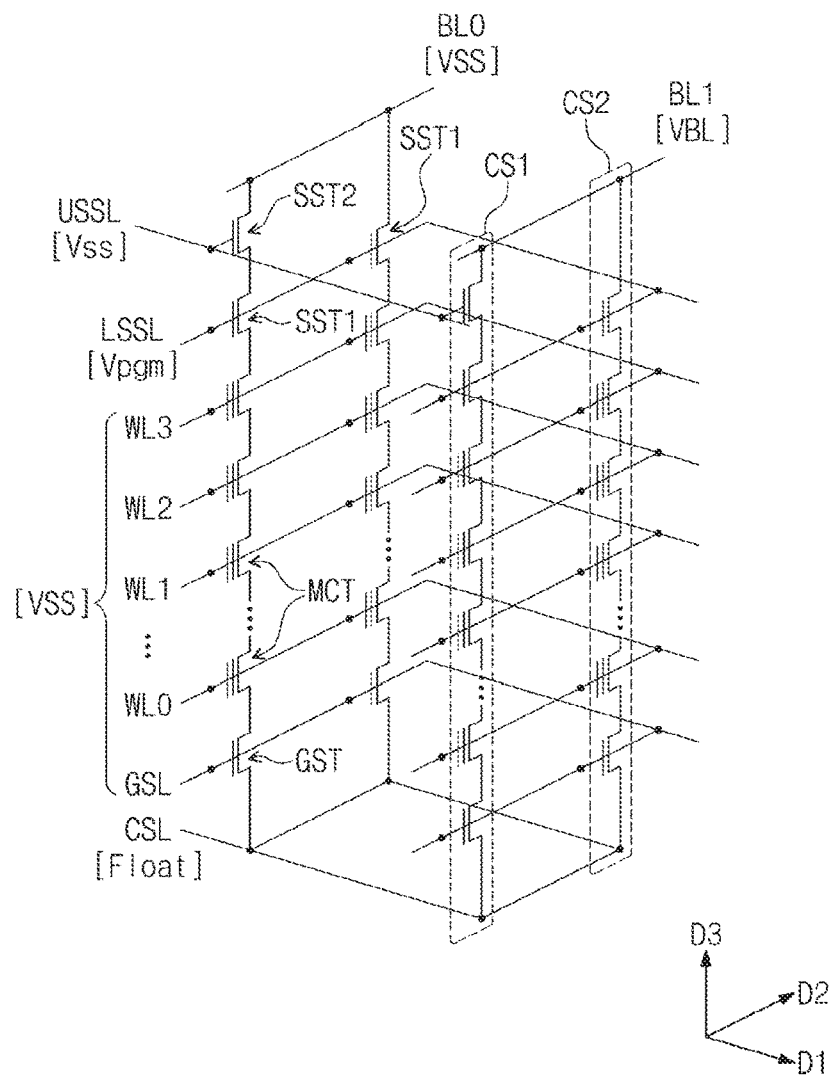
FIG. 9 is a circuit diagram illustrating voltage conditions in a second operation S20 of FIG. 6.
FIG. 10 is a table illustrating threshold voltages of the string selection transistors after the second operation S20 of FIG. 6.

FIG. 9 is a circuit diagram illustrating voltage conditions in a second operation S20 of FIG. 6. FIG. 10 is a table illustrating threshold voltages of the string selection transistors after the second operation S20 of FIG. 6.

Referring to FIGS. 9 and 10, a ground voltage VSS may be applied to the ground selection line GSL, the word lines WL0 to WL3, and the upper string selection line USSL. Thus, the memory cell transistors MCT and the ground selection transistors GST of the first and second cell strings CS1 and CS2 may be turned off and the second string selection transistors SST2 of the first cell strings CS1 may be turned off.

The ground voltage VSS may be applied to a selected bit line BL0, and a desired (and/or alternatively predetermined) bit line voltage VBL may be applied to an unselected bit line BL1. A program voltage Vpgm may be applied to the lower string selection line LSSL. Under these voltage conditions, the ground voltage VSS applied to the selected bit line BL0 may be transmitted to the vertical semiconductor pattern of the second cell string CS2 connected to the selected bit line BL0. Thus a great potential difference may be generated between the lower string selection line LSSL supplied with the program voltage Vpgm and the vertical semiconductor pattern of the second cell string CS2 connected to the selected bit line BL0. As a result, charges may be trapped in the charge storage layer adjacent to the lower string selection line LSSL. Thus, a threshold voltage of the first string selection transistor SST1 of the second cell string CS2 may be increased to the second threshold voltage Vth2 greater than the first threshold voltage Vth1 of the first string selection transistor SST1 of the first cell string CS1.

During the operation of programming the first string selection transistor SST1 of the second cell string CS2, the first string selection transistor SST1 of the first cell string CS1 may not be programmed since the second string selection transistor SST2 of the first cell string CS1 is turned off.

Thus, the first string selection transistor SST1 of the first cell string CS1, which is connected to the lower string selection line LSSL supplied with the program voltage Vpgm, may maintain the first threshold voltage Vth1.

In addition, the first string selection transistors SST1 of the first and second cell strings CS1 and CS2 connected to the unselected bit line BL1 may not be programmed. In some example embodiments, thereafter, another bit line BL1 may be selected, and this program operation may be performed on the first string selection transistor SST1 of the second cell string CS2 connected to the selected bit line BL1. The selection operation of the bit line and the program operation of the first string selection transistor SST1 of the second cell string CS2 may be repeatedly performed to increase threshold voltages of the first string selection transistors SST1 of the second cell strings CS2 connected to all of the bit lines BL0 and BL1. Alternatively, the ground voltage VSS may be applied to all the bit lines BL0 and BL1 at the same time to increase the threshold voltages of the first string selection transistors SST1 of all of the second cell strings CS2 at the same time.

As a result, after the second operation S20, each of the first string selection transistors SST1 of the second cell strings CS2 connected to the bit lines BL0 and BL1 may have the second threshold voltage Vth2.

FIG. 11 is a table illustrating voltage conditions for selecting cell strings in a third operation S30 of FIG. 6.

In the third operation S30, one of the first and second cell strings CS1 and CS2 may be selected to program or read data into or from a selected memory cell transistor MCT (e.g., a selected memory cell). Here, the first string selection transistor SST1 of the first cell string CS1 may have the first threshold voltage Vth1, and the second string selection transistor SST2 of the first cell string CS1 and the first string selection transistor SST1 of the second cell string CS2 may have the second threshold voltage Vth2 greater than the first threshold voltage Vth1, as described with reference to FIGS. 7 to 10. In other words, the first string selection transistors SST1 of the first and second cell strings CS1 and CS2 may have different threshold voltages from each other. In addition, in each of the first cell strings CS1, the first and second string selection transistors SST1 and SST2 may have different threshold voltage from each other.

In more detail, to select the first cell string CS1 in the third operation S30, a ground voltage VSS may be applied to a selected bit line BL and a desired (and/or alternatively predetermined) bit line voltage VBL may be applied to unselected bit lines BL. In addition, a first operating voltage V1 may be applied to a selected upper string selection line USSL, and a second operating voltage V2 less than the first operating voltage V1 may be applied to unselected upper string selection lines USSL and the lower string selection lines LSSL.

To select the second cell string CS2 in the third operation S30, the ground voltage VSS may be applied to a selected bit line BL and the desired (and/or alternatively predetermined) bit line voltage VBL may be applied to unselected bit lines BL. In addition, the first operating voltage V1 may be applied to a selected lower string selection line LSSL, and the second operating voltage V2 less than the first operating voltage V1 may be applied to unselected lower string selection lines LSSL and the upper string selection lines USSL.

To select the first and second cell strings CS1 and CS2 in the third operation S30, the ground voltage VSS may be applied to a selected bit line BL and the desired (and/or alternatively predetermined) bit line voltage VBL may be applied to unselected bit lines BL. In addition, the first operating voltage V1 may be applied to selected lower and upper string selection lines USSL and LSSL, and the second operating voltage V2 may be applied to unselected lower and upper string selection lines USSL and LSSL.

Figures 12, 13:
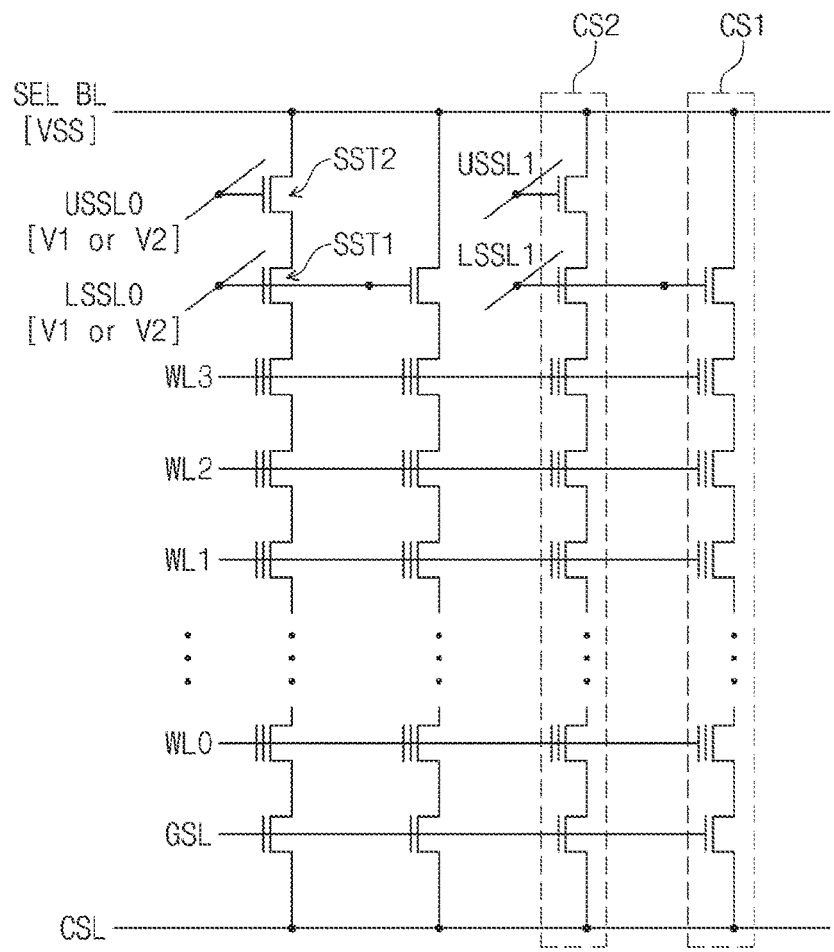
FIGS. 12 and 13 illustrate voltage conditions for selecting first and second cell strings sharing one bit line.

FIGS. 12 and 13 illustrate voltage conditions for selecting first and second cell strings sharing one bit line.

Referring to FIGS. 12 and 13, the first and second cell strings CS1 and CS2 connected to the selected bit line SEL BL may be selected according to voltages applied to the upper and lower string selection lines USSL0, USSL1, LSSL0, and LSSL1. A pair of first and second cell strings CS1 and CS2 adjacent to each other may share one of the lower string selection lines LSSL0 and LSSL1.

In some example embodiments, the ground voltage VSS may be applied to the selected bit line SEL BL, and the desired (and/or alternatively predetermined) bit line voltage VBL may be applied to unselected bit lines BL. The first operating voltage V1 may be applied to a selected upper string selection line USSL0, and the second operating voltage V2 less than the first operating voltage V1 may be applied to selected and unselected lower string selection lines LSSL0 and LSSL1 and an unselected upper string selection line USSL1. Here, the first operating voltage V1 may be greater than the first and second threshold voltages, and the second operating voltage V2 may be greater than the first threshold voltage and less than the second threshold voltage.

Under these voltage conditions, the first and second string selection transistors SST1 and SST2 of the first cell string CS1 connected to the selected upper and lower string selection lines USSL0 and LSSL0 may be turned on, and the first string selection transistor SST1 of the second cell string CS2 connected to the selected lower string selection line LSSL0 may be turned off. Thus, the selected bit line SEL BL may be electrically connected to the selected first cell string CS1 connected to the selected upper and lower string selection lines USSL0 and USSL1.

On the contrary, the second operating voltage V2 may be applied to the upper string selection lines USSL0 and USSL1 and an unselected lower string selection line LSSL1, and the first operating voltage V1 greater than the second operating voltage V2 may be applied to a selected lower string selection line LSSL0. Under these voltage conditions, the second string selection transistor SST2 of the first cell string CS1 connected to the selected lower string selection line LSSL0 may be turned off, and the first string selection transistors SST1 of the first and second cell strings CS1 and CS2 connected to the selected lower string selection line LSSL0 may be turned on. Thus, the selected bit line SEL BL may be electrically connected to the selected second cell string CS2 connected to the selected lower string selection line LSSL0.

In certain embodiments, the first operating voltage V1 may be applied to selected upper and lower string selection lines USSL0 and USSL0. Under these voltage conditions, the first string selection transistors SST1 of the selected first and second cell strings CS1 and CS2 may be turned on and the second string selection transistor SST2 of the selected first cell string CS1 may be turned on. Thus, the selected bit line SEL BL may be electrically connected to the selected first and second cell strings CS1 and CS2. In other words, the selected first and second cell strings CS1 and CS2 may be connected in common to the selected bit line SEL BL.

Figure 14:
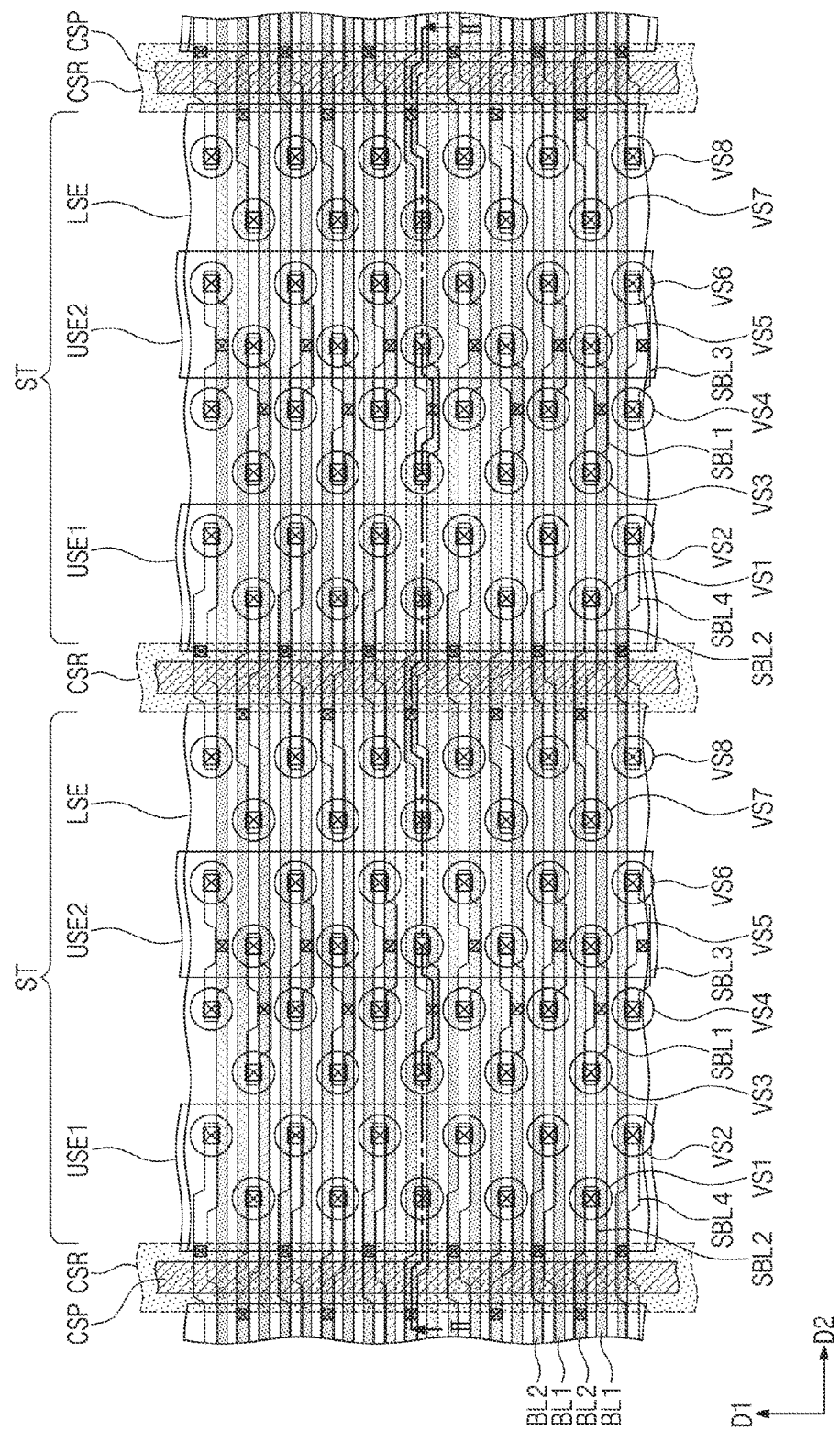
FIG. 14 is a plan view illustrating a 3D semiconductor memory device according to some example embodiments of inventive concepts.
Figure 15:
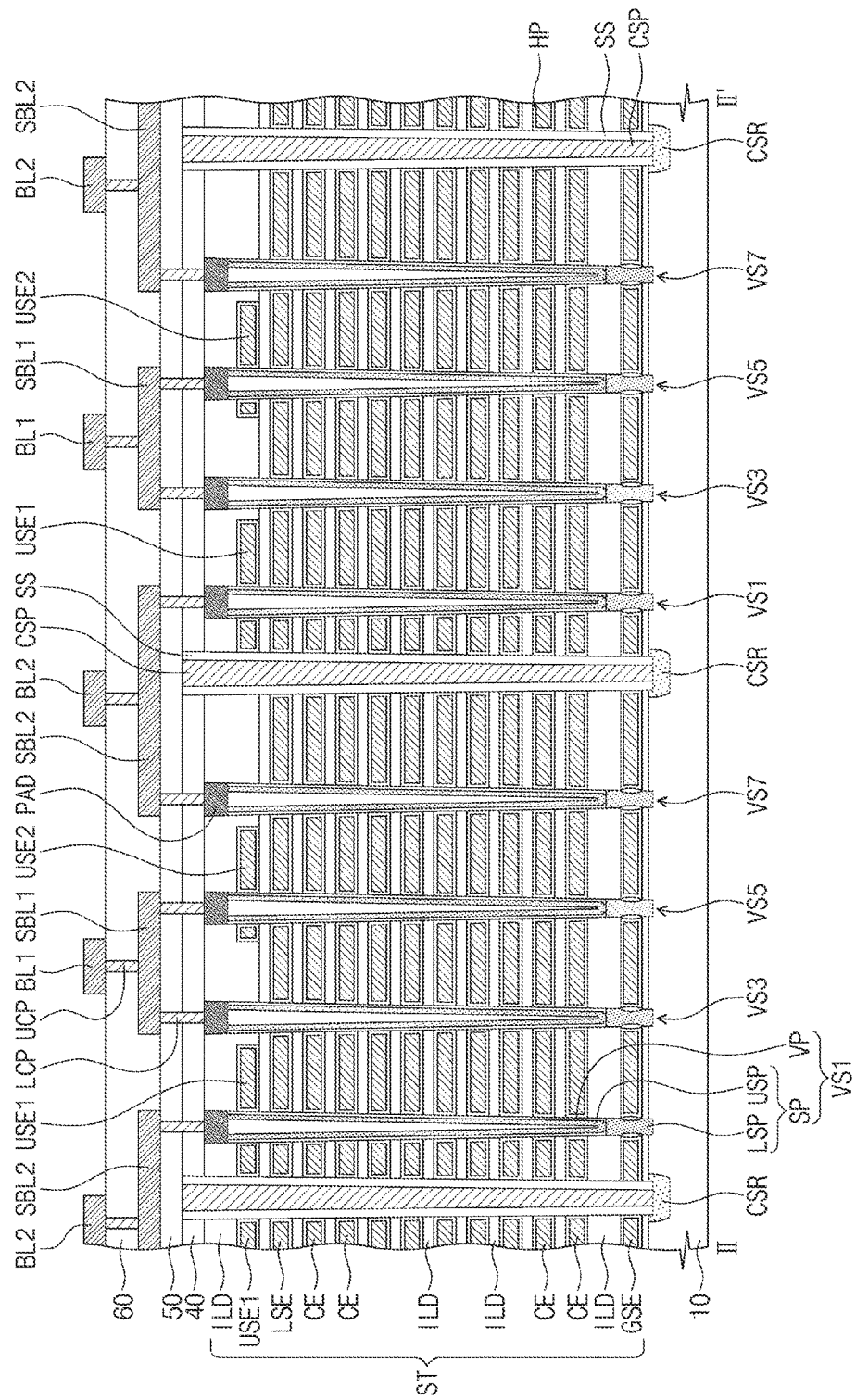
FIG. 15 is a cross-sectional view taken along a line II-II' of FIG. 14.
Figure 16:
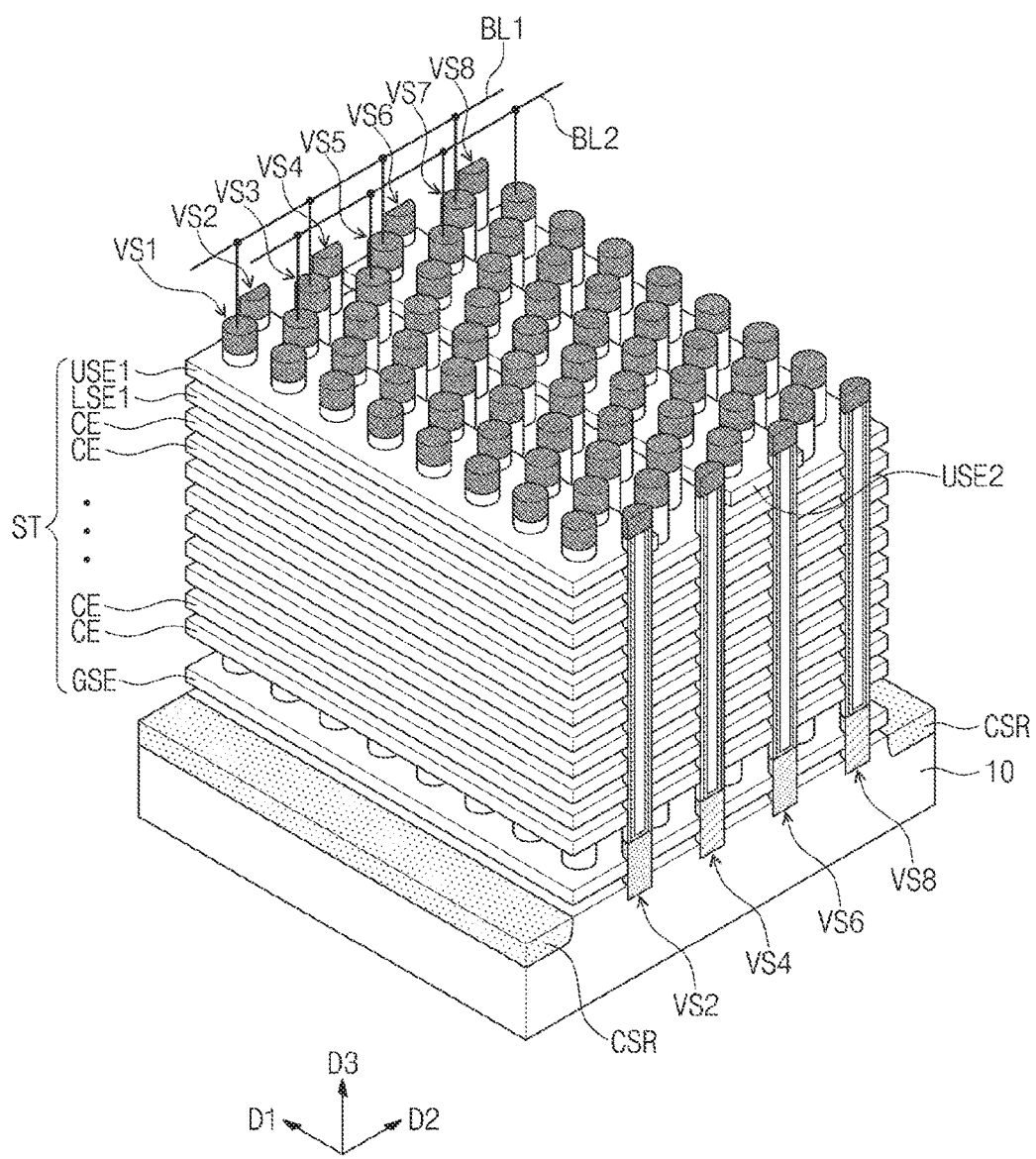
FIG. 16 is a schematic perspective view illustrating a cell array of the 3D semiconductor memory device of FIGS. 14 and 15.

FIG. 14 is a plan view illustrating a 3D semiconductor memory device according to some example embodiments of inventive concepts. FIG. 15 is a cross-sectional view taken along a line II-II' FIG. 14. FIG. 16 is a schematic perspective view illustrating a cell array of the 3D semiconductor memory device of FIGS. 14 and 15. Hereinafter, the descriptions to the same technical features as in the above embodiments will be omitted or mentioned briefly for the purpose of ease and convenience in explanation.

Referring to FIGS. 14, 15, and 16, each of electrode structures ST may include a ground selection electrode GSE adjacent to a substrate 10, a plurality of cell electrodes CE sequentially stacked on the ground selection electrode GSE, a lower selection electrode LSE disposed on the uppermost one of the cell electrodes CE, and first and second upper selection electrodes USE1 and USE2 laterally spaced apart from each other on the lower selection electrode LSE.

First to eighth vertical structures VS1 to VS8 may penetrate each of the electrode structures ST so as to be connected to the substrate 10. In some example embodiments, the first and second vertical structures VS1 and VS2 may penetrate the first upper selection electrode USE1, and the fifth and sixth vertical structures VS5 and VS6 may penetrate the second upper selection electrode USE2. The third, fourth, seventh, and eighth vertical structures VS3, VS4, VS7, and VS8 may be spaced apart from the first and second upper selection electrodes USE1 and USE2. In other words, the third, fourth, seventh, and eighth vertical structures VS3, VS4, VS7, and VS8 may not penetrate the first and second upper selection electrodes USE1 and USE2.

In some example embodiments, the first, second, fifth, and sixth vertical structures VS1, VS2, VS5, and VS6 penetrating the first and second upper selection electrodes USE1 and USE2 may form the first cell strings CS1 described with reference to FIG. 1, and the third, fourth, seventh, and eighth vertical structures VS3, VS4, VS7, and VS8 spaced apart from the first and second upper selection electrodes USE1 and USE2 may form the second cell strings CS2 described with reference to FIG. 1.

Figure 17:
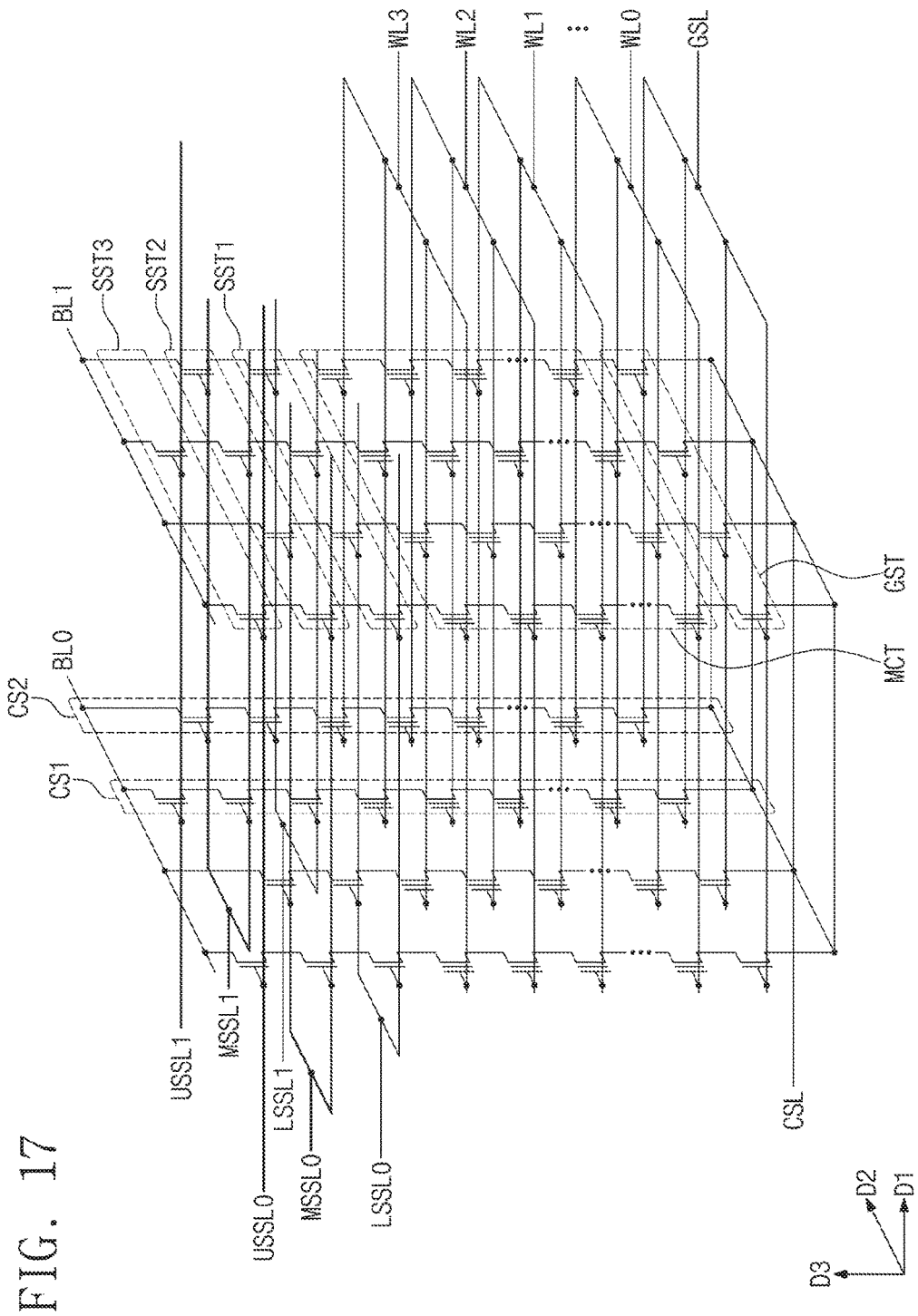
FIG. 17 is a circuit diagram illustrating a cell array of a 3D semiconductor memory device according to some example embodiments of inventive concepts.

FIG. 17 is a circuit diagram illustrating a cell array of a 3D semiconductor memory device according to some example embodiments of inventive concepts. Hereinafter, the descriptions to the same technical features as in the above embodiments of FIG. 1 will be omitted or mentioned briefly for the purpose of ease and convenience in explanation.

Referring to FIG. 17, first cell strings CS1 and second cell strings CS2 may be alternately connected to each of bit lines BL0 and BL1 in a longitudinal direction (e.g., a second direction D2) of each of the bit lines BL0 and BL1. The first cell string CS1 and the second cell string CS2 adjacent to each other in the second direction D2 may be defined as a cell string group. In other words, a plurality of the cell string groups may be connected to each of the bit lines BL0 and BL1. Here, each of the first cell strings CS1 may include first, second, and third string selection transistors SST1, SST2, and SST3 connected in series to each other, and each of the second cell strings CS2 may include first and second string selection transistors SST1 and SST2 connected in series to each other.

The first string selection transistors SST1 of the first and second cell strings CS1 and CS2 of each of the cell string groups may be controlled by a lower string selection line LSSL0 or LSSL1. The second string selection transistors SST2 of the first and second cell strings CS1 and CS2 of each of the cell string groups may be controlled by a middle string selection line MSSL0 or MSSL1. The third string selection transistor SST3 of the first cell string CS1 of each of the cell string groups may be controlled by an upper string selection line USSL0 or USSL1.

Figure 18:
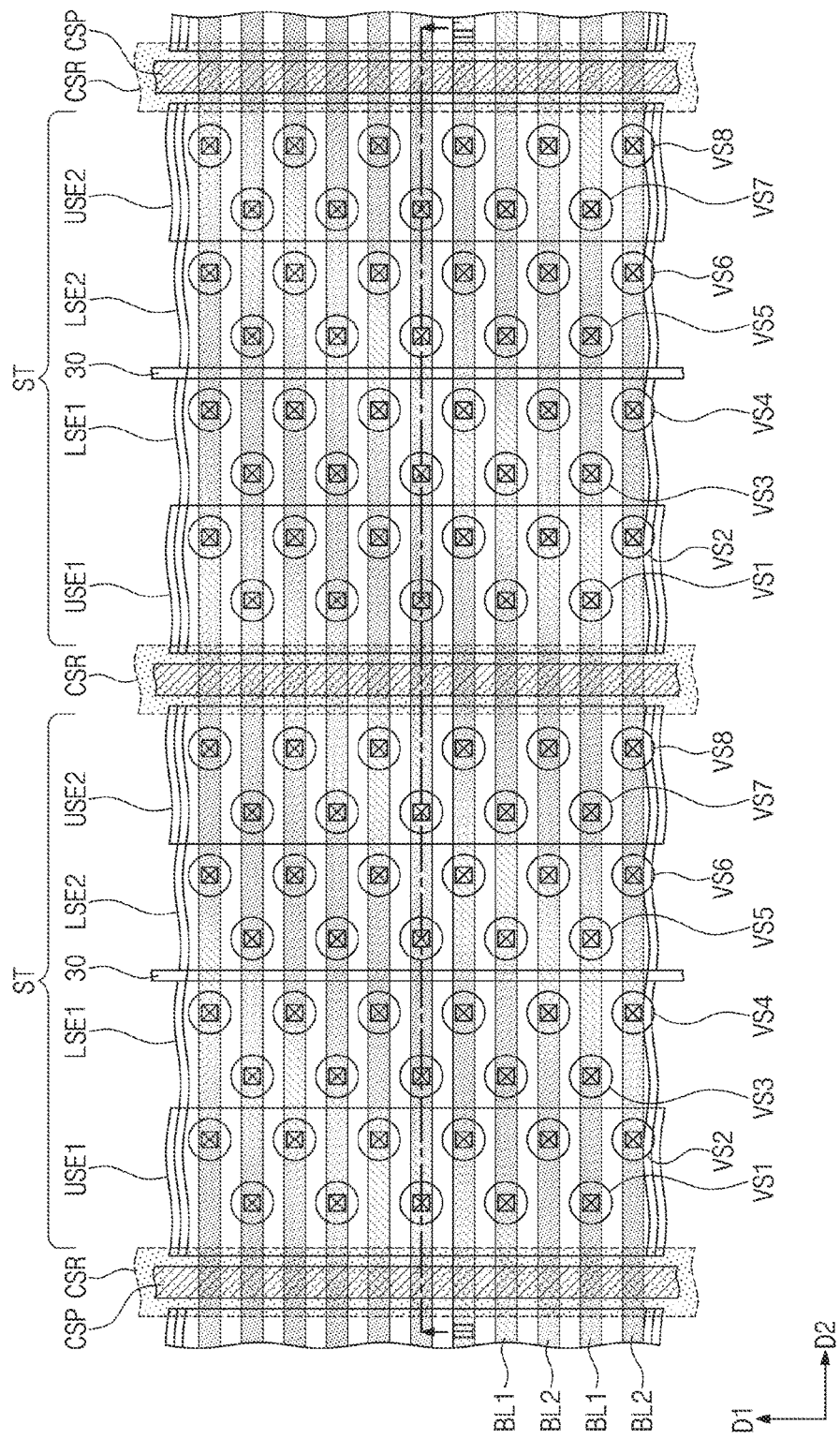
FIG. 18 is a plan view illustrating a 3D semiconductor memory device according to some example embodiments of inventive concepts.
Figure 19:
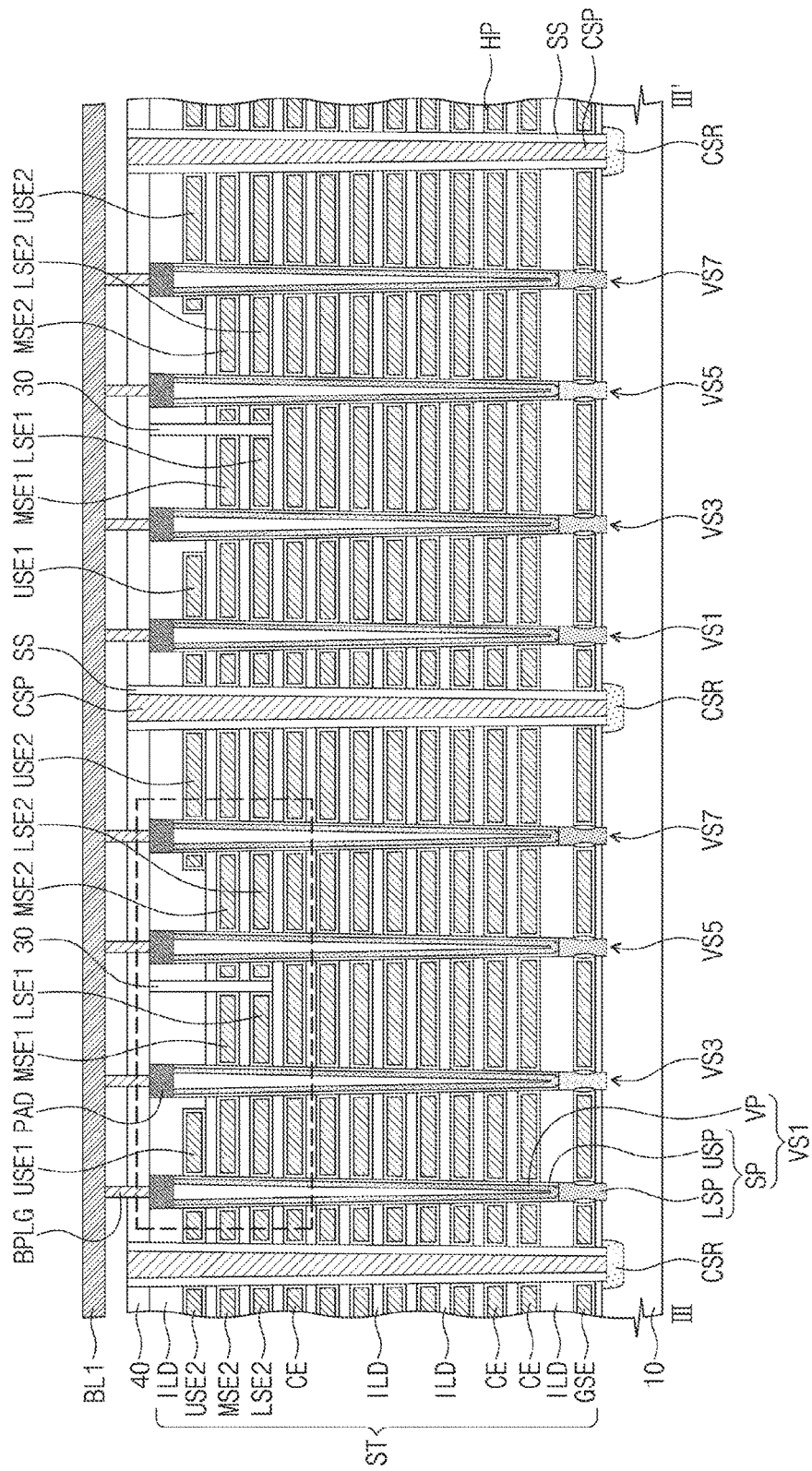
FIG. 19 is a cross-sectional view taken along a line III-III' of FIG. 18.
Figure 20:
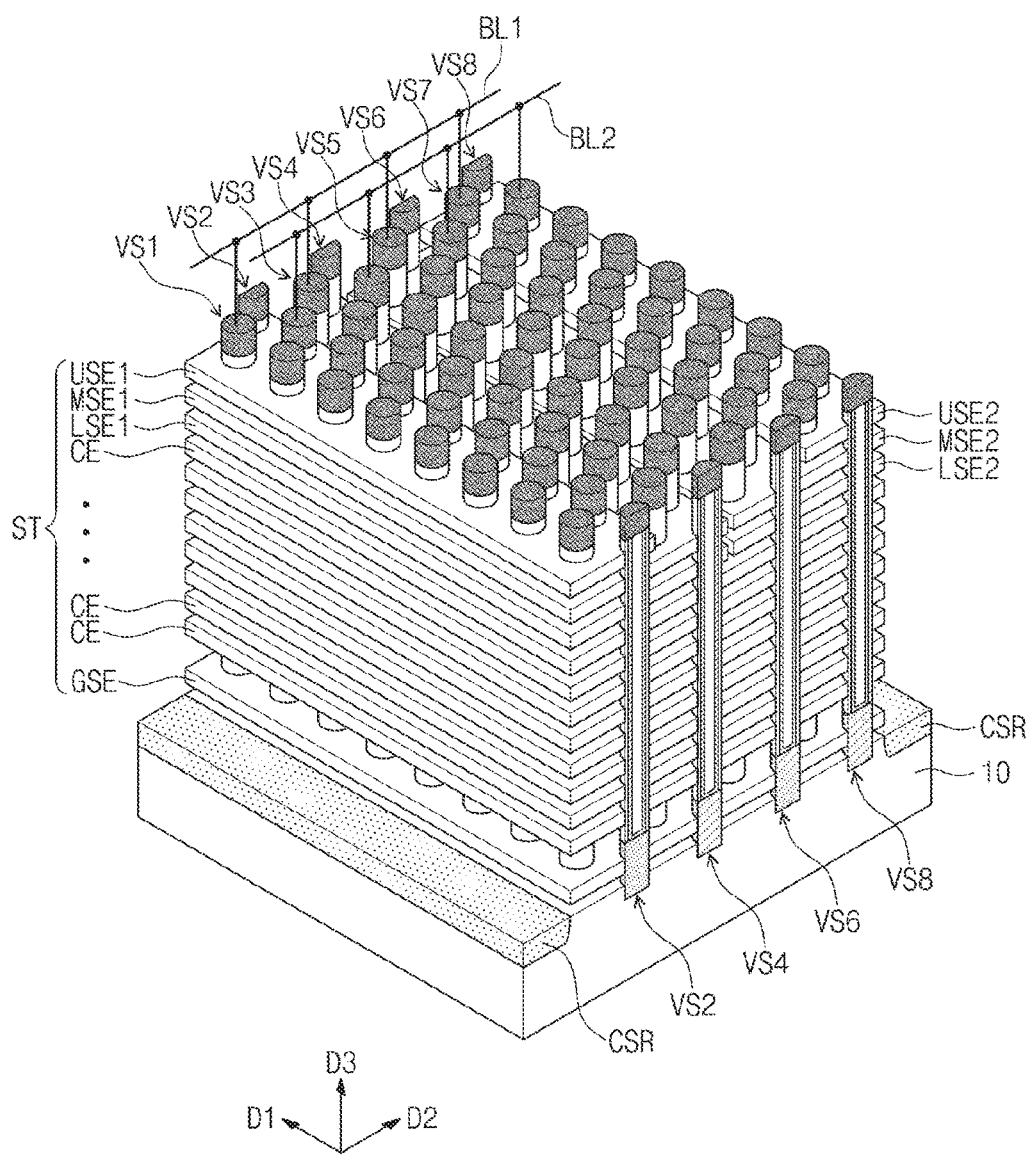
FIG. 20 is a schematic perspective view illustrating a cell array of the 3D semiconductor memory device of FIGS. 18 and 19.
Figure 21:
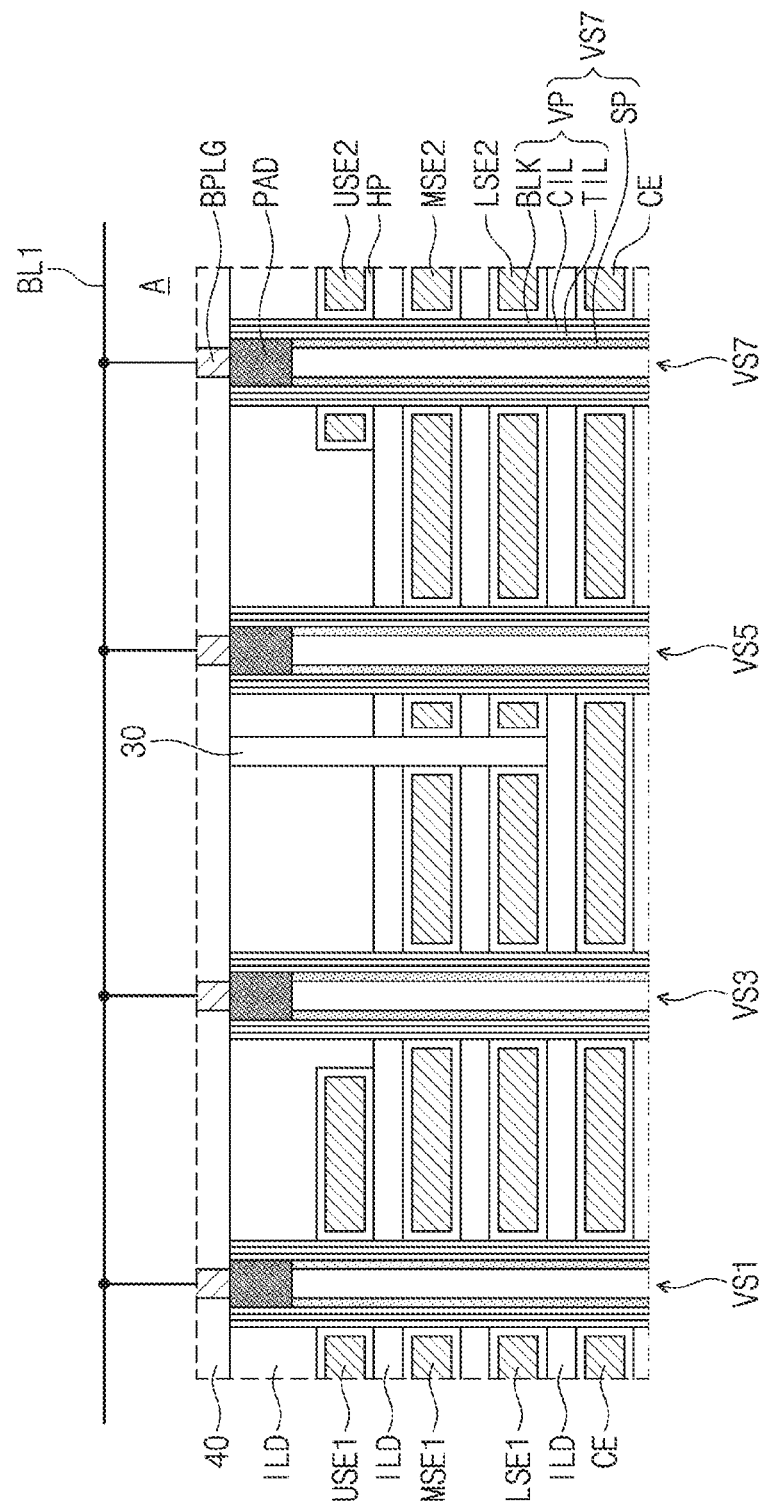
FIG. 21 is an enlarged view of a portion 'A' of FIG. 19.

FIG. 18 is a plan view illustrating a 3D semiconductor memory device according to some example embodiments of inventive concepts. FIG. 19 is a cross-sectional view taken along a line III-III' FIG. 18. FIG. 20 is a schematic perspective view illustrating a cell array of the 3D semiconductor memory device of FIGS. 18 and 19. FIG. 21 is an enlarged view of a portion 'A' of FIG. 19. Hereinafter, the descriptions to the same technical features as in the above embodiments will be omitted or mentioned briefly for the purpose of ease and convenience in explanation.

Referring to FIGS. 18, 19, and 20, each of electrode structures ST may include a ground selection electrode GSE adjacent to a substrate 10, a plurality of cell electrodes CE sequentially stacked on the ground selection electrode GSE, first and second lower selection electrodes LSE1 and LSE2, first and second middle selection electrodes MSE1 and MSE2, and first and second upper selection electrodes USE1 and USE2. The first and second lower, middle and upper selection electrodes LSE1, LSE2, MSE1, MSE2, USE1, and USE2 may be disposed on the uppermost one of the cell electrodes CE. The first lower, middle and upper selection electrodes LSE1, MSE1, and USE1 may be laterally spaced apart from the second lower, middle and upper selection electrodes LSE2, MSE2, and USE2.

In some example embodiments, the ground selection electrode GSE and the cell electrodes CE may have a first width in a second direction D2. Each of the first and second lower and middle selection electrodes LSE1, LSE2, MSE1, and MSE2 may have a second width smaller than the first width in the second direction D2. Each of the first and second upper selection electrodes USE1 and USE2 may have a third width smaller than the second width in the second direction D2.

First to eighth vertical structures VS1 to VS8 may penetrate each of the electrode structures ST so as to be connected to the substrate 10. In some example embodiments, the first and second vertical structures VS1 and VS2 may penetrate the first upper selection electrode USE1, and the seventh and eighth vertical structures VS7 and VS8 may penetrate the second upper selection electrode USE2. The third and fourth vertical structures VS3 and VS4 may be spaced apart from the first and second upper selection electrodes USE1 and USE2 and may penetrate the first lower and middle selection electrodes LSE1 and MSE1. The fifth and sixth vertical structures VS5 and VS6 may be spaced apart from the first and second upper selection electrodes USE1 and USE2 and may penetrate the second lower and middle selection electrodes LSE2 and MSE2. The third, fourth, fifth, and sixth vertical structures VS3, VS4, VS5, and VS6 may be arranged so as to not penetrate the first and second upper selection electrodes USE1 and USE2.

In some example embodiments, each of the electrode structures ST may include an isolation insulating pattern 30 that extends in a first direction D1 on the uppermost cell electrode CE. The isolation insulating pattern 30 may be disposed between the first and second lower selection electrodes LSE1 and LSE2 and between the first and second middle selection electrodes MSE1 and MSE2 to laterally isolate the first lower and middle selection electrodes LSE1 and MSE1 from the second lower and middle selection electrodes LSE2 and MSE2.

Each of the first and second upper selection electrodes USE1 and USE2 may have a first sidewall and a second sidewall opposite to each other, and each of the first and second lower selection electrodes LSE1 and LSE2 may have a first sidewall and a second sidewall opposite to each other. Each of the cell electrodes CE may have a first sidewall and a second sidewall opposite to each other. In some example embodiments, the first sidewall of the first upper selection electrode USE1 may be aligned with the first sidewall of the first lower selection electrode LSE1 and the first sidewalls of the cell electrodes CE. The second sidewall of the second upper selection electrode USE2 may be aligned with the second sidewall of the second lower selection electrode LSE2 and the second sidewalls of the cell electrodes CE.

In certain embodiments, the third and fourth vertical structures VS3 and VS4 may penetrate the first upper selection electrode USE1, and the fifth and sixth vertical structures VS5 and VS6 may penetrate the second upper selection electrode USE2. In certain embodiments, the second and third vertical structures VS2 and VS3 may penetrate the first upper selection electrode USE1, and the sixth and seventh vertical structures VS6 and VS7 may penetrate the second upper selection electrode USE2.

First and second bit lines BL1 and BL2 may extend in the second direction D2 to intersect the electrode structures ST and may be alternately arranged in the first direction D1. In the present embodiment, a width of each of the first and second bit lines BL1 and BL2 may be greater than about a half of a width of each of the vertical structures VS1 to VS8.

Each of the first and second bit lines BL1 and BL2 may be connected in common to the vertical structures arranged along the second direction D2. In more detail, each of the first bit lines BL1 may be connected in common to the first, third, fifth, and seventh vertical structures VS1, VS3, VS5, and VS7, and each of the second bit lines BL2 may be connected in common to the second, fourth, sixth, and eighth vertical structures VS2, VS4, VS6, and VS8.

Each of the first to eighth vertical structures VS1 to VS8 may include the vertical semiconductor pattern SP and the vertical insulating pattern VP surrounding the vertical semiconductor pattern SP, as described with reference to FIGS. 3 to 5.

As illustrated in FIG. 21, the vertical insulating pattern VP may include the tunnel insulating layer TIL, the charge storage layer CIL, and the blocking insulating layer BLK, which constitute the data storage layer in the NAND flash memory device. The vertical insulating pattern VP may vertically extend from between each of the vertical structures VS1 to VS8 and the cell electrodes CE into between each of the vertical structures VS1 to VS8 and the first lower, middle, and upper selection electrodes LSE1, MSE1, and USE1 (or the second lower, middle, and upper selection electrodes LSE2, MSE2, and USE2).

According to the present embodiment, the first, second, seventh, and eighth vertical structures VS1, VS2, VS7, and VS8 penetrating the first and second upper selection electrodes USE1 and USE2 may form the first cell strings CS1 described with reference to FIG. 17. In addition, the third, fourth, fifth, and sixth vertical structures VS3, VS4, VS5, and VS6 spaced apart from the first and second upper selection electrodes USE1 and USE2 may form the second cell strings CS2 described with reference to FIG. 17.

FIG. 22 is a flow chart illustrating a method of operating the 3D semiconductor memory device of FIGS. 17 to 21. FIG. 23 is a table illustrating threshold voltages of string selection transistors in the cell array of the 3D semiconductor memory device illustrated in FIGS. 17 to 21. In the present embodiment, the descriptions to the same technical features as in the above embodiments of FIGS. 6 to 13 will be omitted or mentioned briefly for the purpose of ease and convenience in explanation.

Referring to FIGS. 17 and 22, a method of operating a 3D semiconductor memory device may include a first operation S110 of programming the third string selection transistor SST3 of the first cell string CS1, a second operation S120 of programming the second string selection transistor SST2 of the second cell string CS2, a third operation S130 of programming the first string selection transistor SST1 of the first cell string CS1, and a fourth operation S140 of performing a program operation, a read operation, or an erase operation on the memory cell transistors MCT (e.g., the memory cells).

In the first operation S110, a program voltage may be applied to a selected upper string selection line USSL0 or USSL1, and a ground voltage may be applied to selected lower and middle string selection lines LSSL0 and MSSL0 or LSSL1 and MSSL1. Thus, charges may be trapped in the charge storage layer used as a gate insulating layer of the third string selection transistor SST3 of a selected first cell string CS1. As a result, a threshold voltage of the third string selection transistor SST3 may be increased to a second threshold voltage Vth2 greater than a first threshold voltage Vth1 of the first and second string selection transistors SST1 and SST2 of the selected first cell string CS1.

In the second operation S120, the program voltage may be applied to the selected middle string selection line MSSL0 or MSSL1, and the ground voltage may be applied to the selected upper and lower string selection lines USSL0 and LSSL0 or USSL1 and LSSL1. Thus, charges may be trapped in the charge storage layer of the second string selection transistor SST2 of a selected second cell string CS2. As a result, a threshold voltage of the second string selection transistor SST2 of the selected second cell string CS2 may be increased to the second threshold voltage Vth2 greater than the first threshold voltage Vth1 of the second string selection transistor SST2 of the first cell string CS1.

In the third operation S130, the program voltage may be applied to the selected lower string selection line LSSL0 or LSSL1. In addition, an operating voltage greater than the first threshold voltage Vth1 and less than the second threshold voltage Vth2 may be applied to the selected middle string selection line MSSL0 or MSSL1. Furthermore, an operating voltage greater than the second threshold voltage Vth2 may be applied to the selected upper selection line USSL0 or USSL1 to turn on the third string selection transistor SST3 of the first cell string CS1. Thus, charges may be trapped in the charge storage layer of the first string selection transistor SST1 of the selected first cell string CS1. As a result, a threshold voltage of the first string selection transistor SST1 of the selected first cell string CS1 may be increased to the second threshold voltage Vth2 greater than the first threshold voltage Vth1 of the second string selection transistor SST2 of the selected first cell string CS1.

In the fourth operation S140, the upper string selection line USSL0 or USSL1 may be in a floating state, and the electrical connection between the bit line BL0 or BL1 and the first and second cell strings CS1 and CS2 may be controlled by the lower and middle string selection lines LSSL0 and MSSL0 or LSSL1 and MSSL1.

Figure 24:
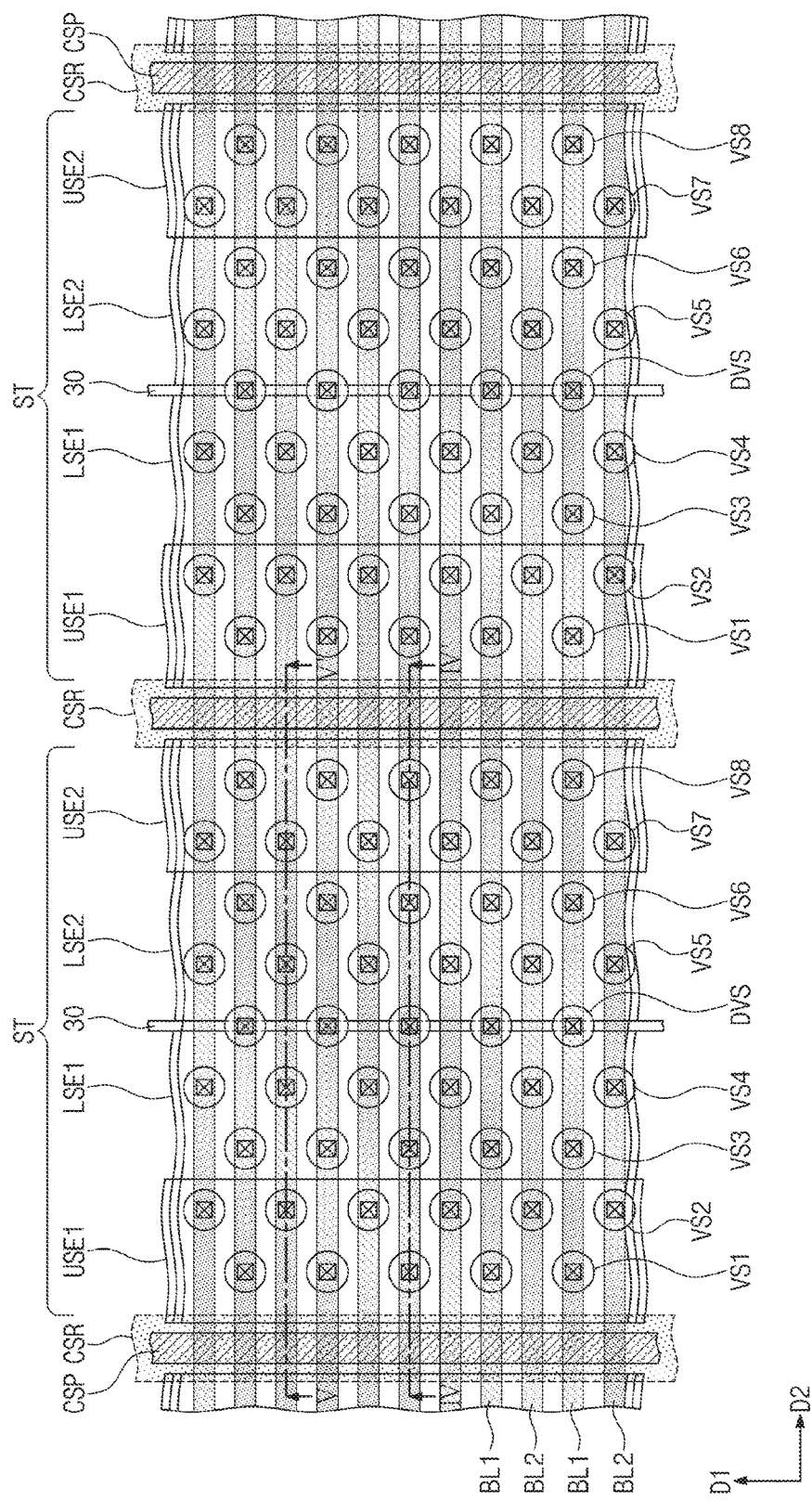
FIG. 24 is a plan view illustrating a 3D semiconductor memory device according to some example embodiments of inventive concepts.
Figure 25:
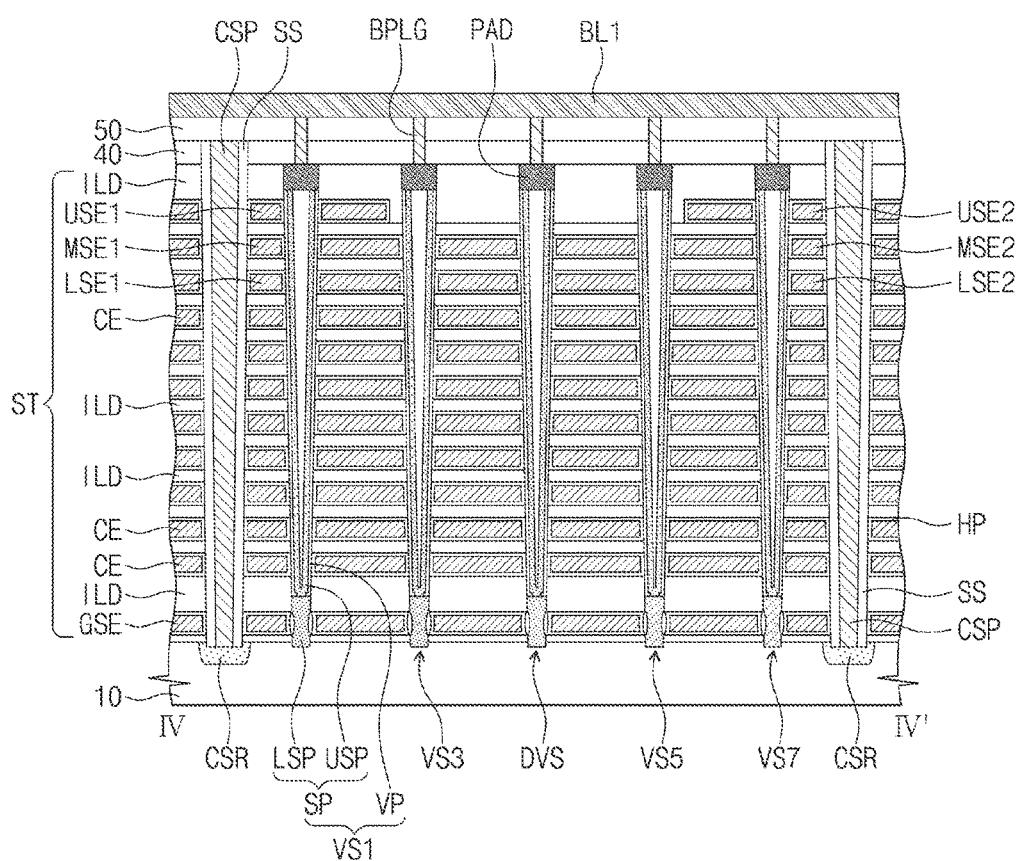
FIGS. 25 and 26 are cross-sectional views taken along lines IV-IV' and V-V' of FIG. 24, respectively.
Figure 26:
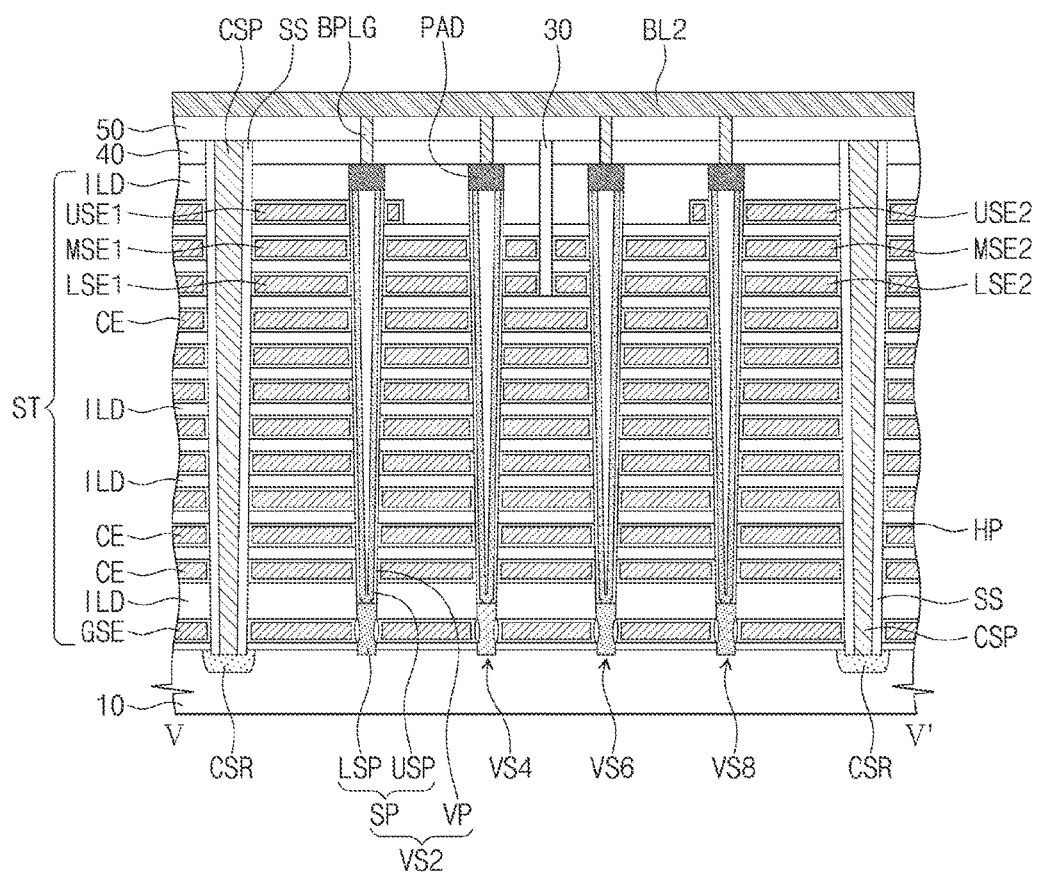

FIG. 24 is a plan view illustrating a 3D semiconductor memory device according to some example embodiments of inventive concepts. FIGS. 25 and 26 are cross-sectional views taken along lines IV-IV' and V-V' of FIG. 24, respectively. Hereinafter, the descriptions to the same technical features as in the above embodiments of FIGS. 18 to 21 will be omitted or mentioned briefly for the purpose of ease and convenience in explanation.

Referring to FIGS. 24, 25, and 26, dummy vertical structures DVS may penetrate each of the electrode structures ST between the first and second lower selection electrodes LSE1 and LSE2 and between the first and second middle selection electrodes MSE1 and MSE2. Here, the dummy vertical structures DVS may be arranged in a line along the first direction D1.

Each of the dummy vertical structures DVS may have substantially the same structure as the first to eighth vertical structures VS1 to VS8. In other words, each of the dummy vertical structures DVS may include a vertical semiconductor pattern SP penetrating the electrode structure ST so as to be connected to the substrate 10, and a vertical insulating pattern VP surrounding the vertical semiconductor pattern SP. In addition, the vertical semiconductor pattern SP of the dummy vertical structure DVS may include a lower semiconductor pattern LSP and an upper semiconductor pattern USP.

In addition, each of the electrode structures ST may include the isolation insulating pattern 30 extending in the first direction D1 on the uppermost cell electrode CE, and the dummy vertical structures DVS may penetrate the isolation insulating pattern 30.

Figure 27:
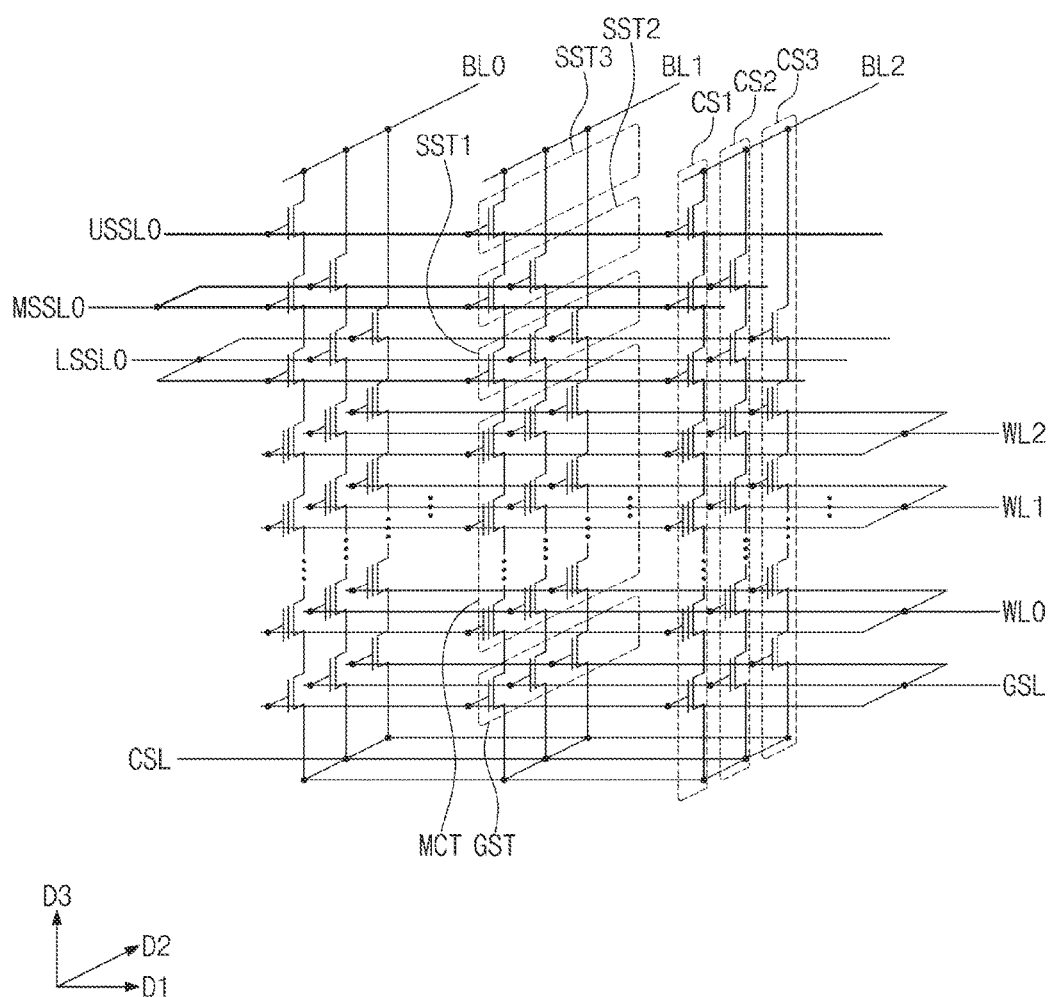
FIG. 27 is a circuit diagram illustrating a cell array of a 3D semiconductor memory device according to some example embodiments of inventive concepts.

FIG. 27 is a circuit diagram illustrating a cell array of a 3D semiconductor memory device according to some example embodiments of inventive concepts. Hereinafter, the descriptions to the same technical features as in the above embodiments of FIG. 1 will be omitted or mentioned briefly for the purpose of ease and convenience in explanation.

Referring to FIG. 27, a cell array of a 3D semiconductor memory device may include common source lines CSL, bit lines BL0, BL1, and BL2, and first, second, and third cell strings CS1, CS2, and CS3 connected between the common source lines CSL and the bit lines BL0 to BL2.

In more detail, the first to third cell strings CS1, CS2, and CS3 may be connected in parallel to each of the bit lines BL0, BL1, and BL2. The first cell string CS1, the second cell string CS2 and the third cell string CS3, which are adjacent to each other and are connected to each of the bit lines BL0 to BL1, may constitute a cell string group. A plurality of the cell string groups may be connected to each of the bit lines BL0 to BL1. The numbers of string selection transistors SST1, SST2, and SST3 of the first to third cell strings CS1, CS2, and CS3 may be different from each other. The third string selection transistor SST3 may be a top string selection transistor in the first cell string CS1. The second string selection transistor SST2 may be a top string selection transistor in the second cell string CS2 and a middle string selection transistor in the first cell string CS1. In more detail, the first cell string CS1 may include m string selection transistors, the second cell string CS2 may include n string selection transistors, and the third cell string CS3 may include 1 string selection transistors. Here, "m", "n", and "1" are natural numbers different from each other.

In some example embodiments, each of the first cell strings CS1 may include first, second, and third string selection transistors SST1, SST2, and SST3 connected in series to each other. Each of the second cell strings CS2 may include first and second string selection transistors SST1 and SST2 connected in series to each other, and each of the third cell strings CS3 may include a first string selection transistor SST1 connected between a corresponding one of the bit lines BL0 to BL2 and the memory cell transistor MCT. In each of the cell string groups, the third string selection transistor STT3 of the first cell string CS1 may be controlled by one upper string selection line USSL0, the second string selection transistors SST2 of the first and second cell strings CS1 and CS2 may be controlled by one middle string selection line MSSL0, and the first string selection transistors SST1 of the first to third cell strings CS1, CS2 and CS3 may be controlled by one lower string selection line LSSL0.

In some example embodiments, electrical connection between the first to third cell strings CS1 to CS3 of each of the cell string groups and a corresponding one of the bit lines BL0 to BL2 may be controlled by the lower, middle, and upper string selection lines LSSL0, MSSL0, and USSL0.

Figure 28:
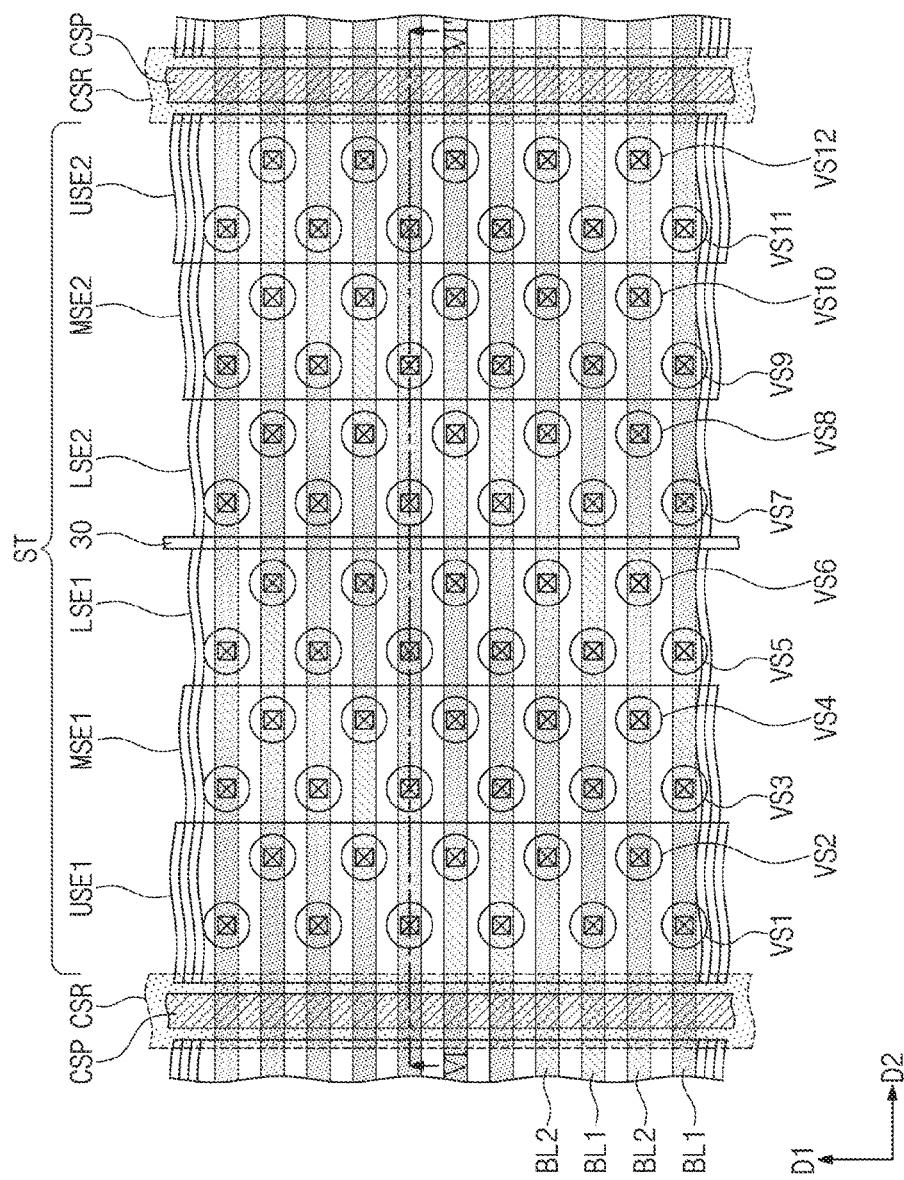
FIG. 28 is a plan view illustrating a cell array of a 3D semiconductor memory device according to some example embodiments of inventive concepts.
Figure 29:
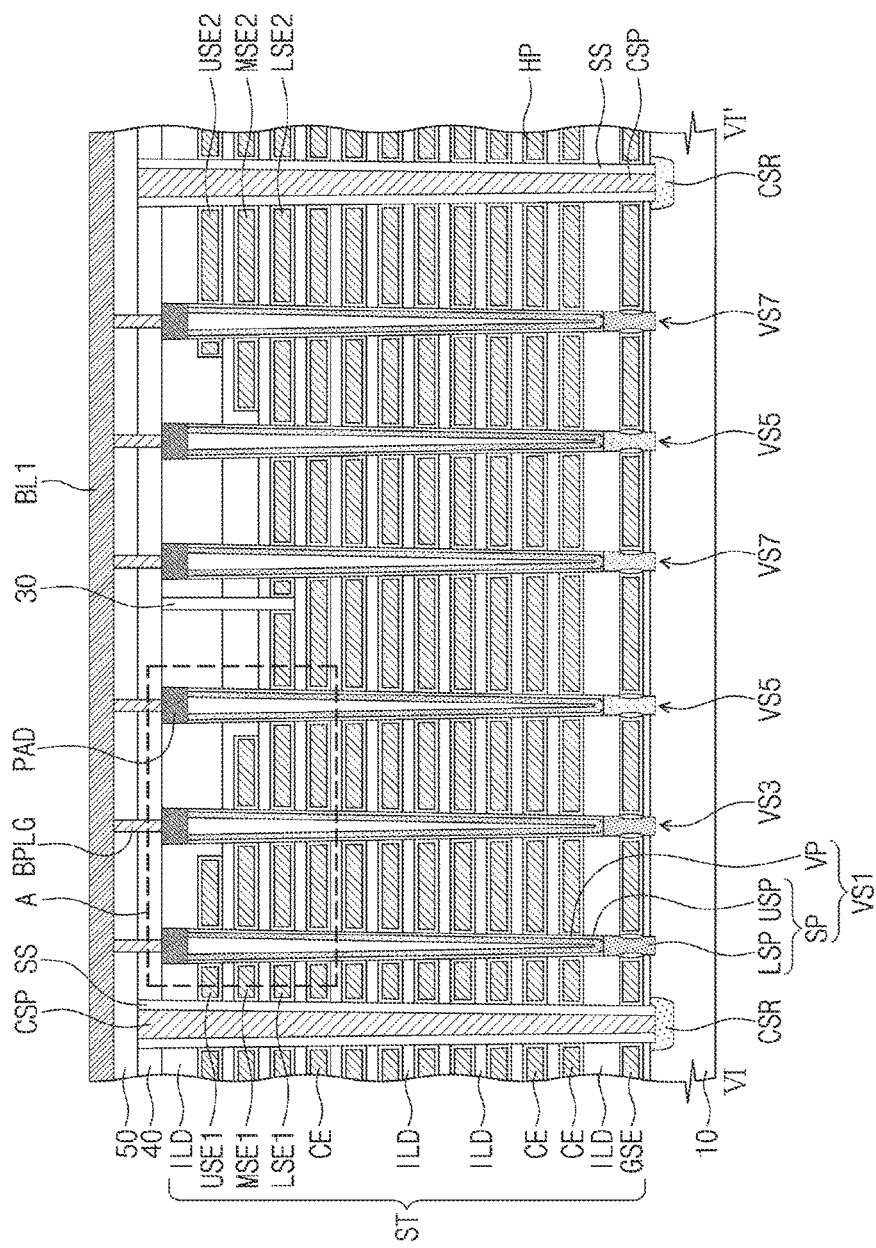
FIG. 29 is a cross-sectional view taken along a line VI-VI' of FIG. 28.
Figure 30:
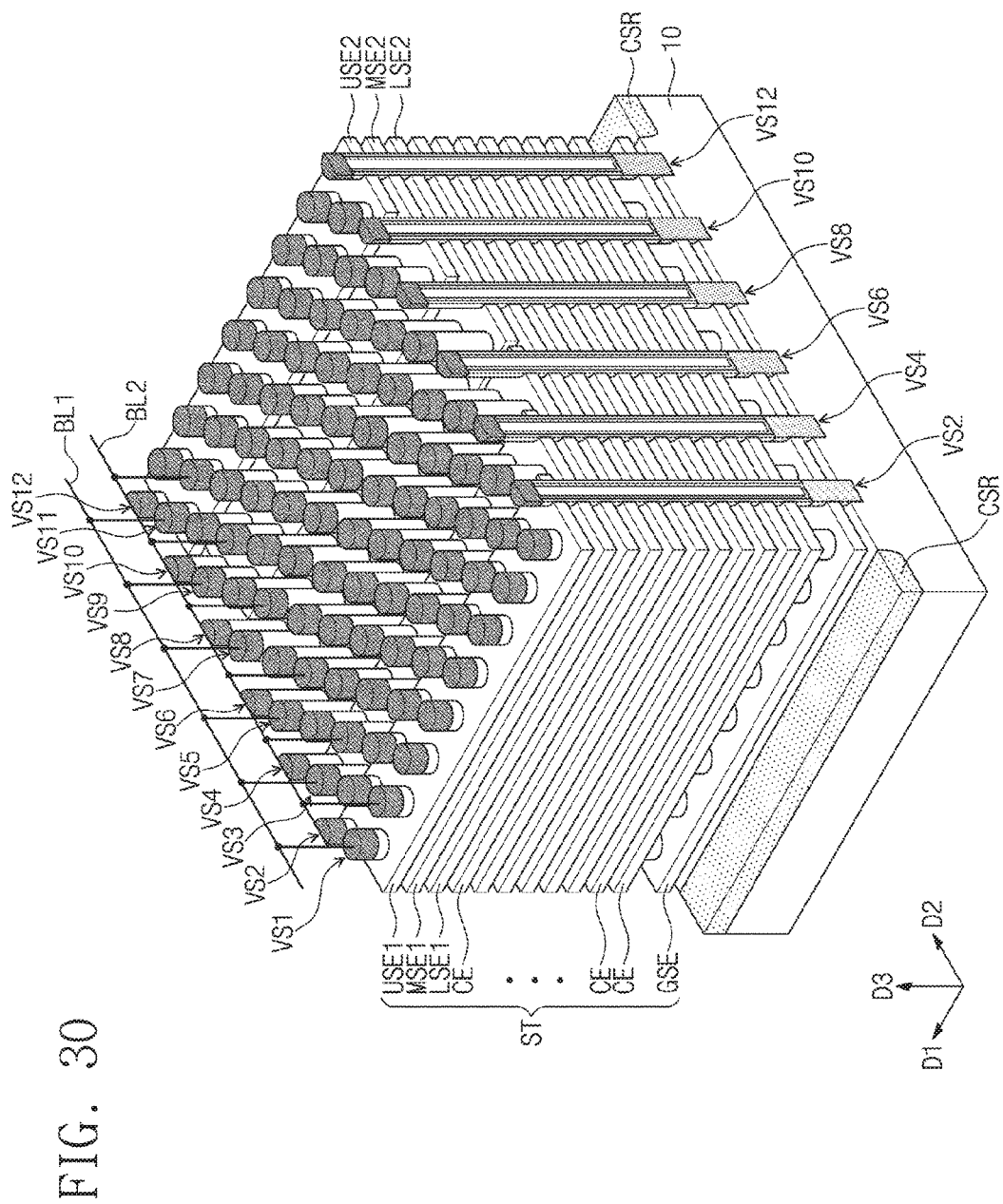
FIG. 30 is a schematic perspective view illustrating the cell array of the 3D semiconductor memory device of FIGS. 28 and 29.
Figure 31:
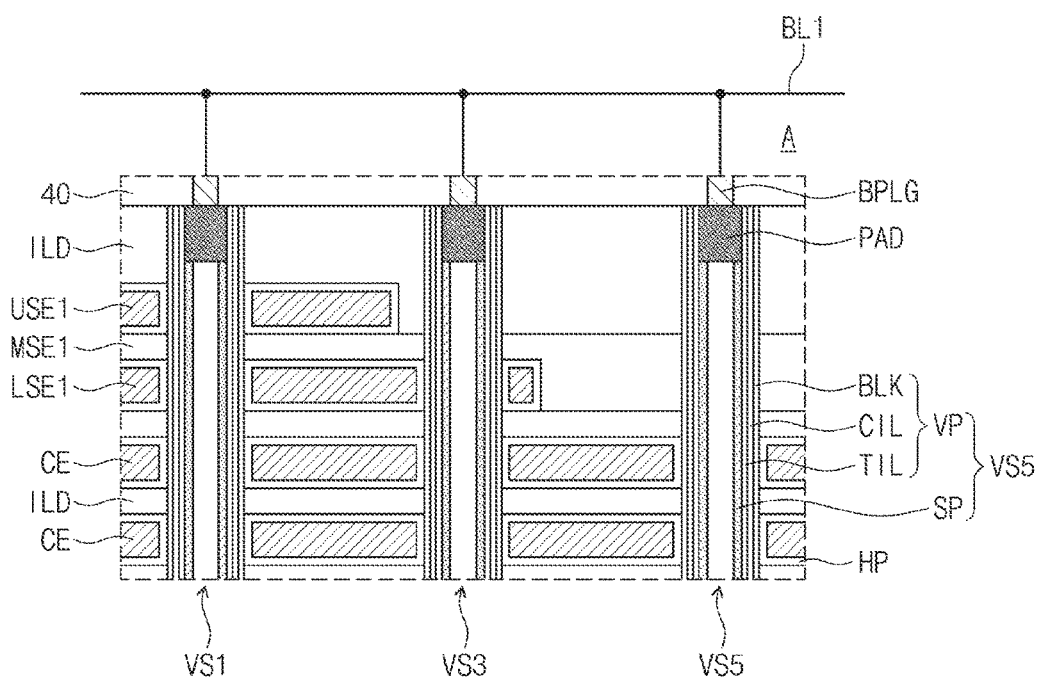
FIG. 31 is an enlarged view of a portion 'A' of FIG. 29.

FIG. 28 is a plan view illustrating a cell array of a 3D semiconductor memory device according to some example embodiments of inventive concepts. FIG. 29 is a cross-sectional view taken along a line VI-VI' FIG. 28. FIG. 30 is a schematic perspective view illustrating the cell array of the 3D semiconductor memory device of FIGS. 28 and 29. FIG. 31 is an enlarged view of a portion 'A' of FIG. 29. Hereinafter, the descriptions to the same technical features as in the above embodiments will be omitted or mentioned briefly for the purpose of ease and convenience in explanation.

Referring to FIGS. 28, 29, and 30, an electrode structure ST may include a ground selection electrode GSE adjacent to a substrate 10, a plurality of cell electrodes CE sequentially stacked on the ground selection electrode GSE, first and second lower selection electrodes LSE1 and LSE2, first and second middle selection electrodes MSE1 and MSE2, and first and second upper selection electrodes USE1 and USE2.

The first and second lower selection electrodes LSE1 and LSE2 may be laterally spaced apart from each other on the uppermost cell electrode CE. The first middle selection electrode MSE1 may be disposed on the first lower selection electrode LSE1. The second middle selection electrode MSE2 may be laterally spaced apart from the first middle selection electrode MSE1 and may be disposed on the second lower selection electrode LSE2. The first upper selection electrode USE1 may be disposed on the first middle selection electrode MSE1. The second upper selection electrode USE2 may be laterally spaced apart from the first upper selection electrode USE1 and may be disposed on the second middle selection electrode MSE2.

The first lower, middle, and upper selection electrodes LSE1, MSE1, and USE1 may be stacked in a staircase shape on the uppermost cell electrode CE. The second lower, middle, and upper selection electrodes LSE2, MSE2, and USE2 may also be stacked in a staircase shape on the uppermost cell electrode CE. In more detail, in the electrode structure ST, each of the cell electrodes CE and the ground selection electrode GSE may have a first width in the second direction D2 and each of the first and second lower selection electrodes LSE1 and LSE2 may have a second width smaller than the first width in the second direction D2. Each of the first and second middle selection electrodes MSE1 and MSE2 may have a third width smaller than the second width in the second direction D2, and each of the first and second upper selection electrodes USE1 and USE2 may have a fourth electrode smaller than the third width in the second direction D2.

In addition, the electrode structure ST may include an isolation insulating pattern 30 that extends in the first direction D1 on the uppermost cell electrode CE to isolate the first lower selection electrode LSE1 from the second lower selection electrode LSE2.

In some example embodiments, first to twelfth vertical structures VS1 to VS12 may penetrate each of the electrode structures ST so as to be connected to the substrate 10. Horizontal distances of the first to twelfth vertical structures VS1 to VS12 from the common source region CSR disposed at a side of the electrode structure ST may be different from each other.

Electrical connection between bit lines BL1 and BL2 and the first to sixth vertical structures VS1 to VS6 may be controlled by the first lower, middle, and upper selection electrodes LSE1, MSE1, and USE1. Electrical connection between the bit lines BL1 and BL2 and the seventh to twelfth vertical structures VS7 to VS12 may be controlled by the second lower, middle, and upper selection electrodes LSE2, MSE2, and USE2. In some example embodiments, the first and second vertical structures VS1 and VS2 may penetrate the first upper, middle, and lower selection electrodes USE1, MSE1, and LSE1. The third and fourth vertical structures VS3 and VS4 may be spaced apart from the first upper selection electrode USE1 and may penetrate the first middle and lower selection electrodes MSE1 and LSE1. The fifth and sixth vertical structures VS5 and VS6 may be spaced apart from the first upper and middle selection electrodes USE1 and MSE1 and may penetrate the first lower selection electrode LSE1.

The seventh and eighth vertical structures VS7 and VS8 may be spaced apart from the second upper and middle selection electrodes USE2 and MSE2 and may penetrate the second lower selection electrode LSE2. The ninth and tenth vertical structures VS9 and VS10 may be spaced apart from the second upper selection electrode USE2 and may penetrate the second middle and lower selection electrodes MSE2 and LSE2. The eleventh and twelfth vertical structures VS11 and VS12 may penetrate the second upper, middle, and lower selection electrodes USE2, MSE2, and LSE2.

In the present embodiment, the first, second, eleventh, and twelfth vertical structures VS1, VS2, VS11, and VS12 may form the first cell strings CS1 described with reference to FIG. 27. The third, fourth, ninth, and tenth vertical structures VS3, VS4, VS9, and VS10 may form the second cell strings CS2 described with reference to FIG. 27. The fifth, sixth, seventh, and eighth vertical structures VS5, VS6, VS7, and VS8 may form the third cell strings CS3 described with reference to FIG. 27.

Each of the first to twelfth vertical structures VS1 to VS12 may include the vertical semiconductor pattern SP and the vertical insulating pattern VP surrounding the vertical semiconductor pattern SP, as described with reference to FIGS. 3 to 5. The vertical semiconductor pattern SP may include a semiconductor material, and the vertical insulating pattern VP may include a tunnel insulating layer TIL, a charge storage layer CIL, and a blocking insulating layer BLK, which constitute a data storage layer of a NAND flash memory device. The vertical insulating pattern VP may vertically extend from between each of the vertical structures VS1 to VS12 and the cell electrodes CE into between each of the vertical structures VS1 to VS12 and the first lower, middle, and upper selection electrodes LSE1, MSE1, and USE1 (or the second lower, middle, and upper selection electrodes LSE2, MSE2, and USE2).

In some example embodiments, each of the first bit lines BL1 may be connected in common to the first, third, fifth, seventh, ninth, and eleventh vertical structures VS1, VS3, VS5, VS7, VS9, and VS11, and each of the second bit lines BL2 may be connected in common to the second, fourth, sixth, eighth, tenth, and twelfth vertical structures VS2, VS4, VS6, VS8, VS10, and VS12. In the present embodiment, a width of each of the first and second bit lines BL1 and BL2 may be greater than about a half of a width of each of the vertical structures VS1 to VS12.

FIG. 32 is a flow chart illustrating a method of operating the 3D semiconductor memory device of FIGS. 28 to 31. FIG. 33 is a table illustrating threshold voltages of string selection transistors in the cell array of the 3D semiconductor memory device illustrated in FIGS. 28 to 31. In the present embodiment, the descriptions to the same technical features as in the above embodiments of FIGS. 6 to 13 will be omitted or mentioned briefly for the purpose of ease and convenience in explanation.

Referring to FIGS. 30 and 32, a method of operating a 3D semiconductor memory device may include a first operation S210 of programming the third string selection transistor SST3 of the first cell string CS1, a second operation S220 of programming the second string selection transistor SST2 of the second cell string CS2, a third operation S230 of programming the first string selection transistor SST1 of the third cell string CS3, and a fourth operation S240 of performing at least one of a program operation, a read operation, or an erase operation on the memory cell transistors MCT (e.g., the memory cells). Here, the first to fourth operations S210, S220, S230, and S240 may be sequentially performed.

In the first operation S210, a program voltage may be applied to a selected upper string selection line USSL0, and a ground voltage may be applied to selected lower and middle string selection lines LSSL0 and MSSL0. Thus, a threshold voltage of the third string selection transistor SST3 of the first cell string CS1 may be increased to a second threshold voltage Vth2 greater than a first threshold voltage Vth1 of the first and second string selection transistors SST1 and SST2 of the first cell string CS1.

In the second operation S220, the program voltage may be applied to the selected middle string selection line MSSL0, and the ground voltage may be applied to the selected upper and lower string selection lines USSL0 and LSSL0. Thus, charges may be trapped in the charge storage layer used as a gate insulating layer of the second string selection transistor SST2 of the second cell string CS2. As a result, a threshold voltage of the second string selection transistor SST2 of the second cell string CS2 may be increased to the second threshold voltage Vth2 greater than the first threshold voltage Vth1 of the second string selection transistor SST2 of the first cell string CS1.

In the third operation S230, the program voltage may be applied to the selected lower string selection line LSSL0, and the ground voltage may be applied to the selected upper and middle string selection lines USSL0 and MSSL0. Thus, charges may be trapped in the charge storage layer used as a gate insulating layer of the first string selection transistor SST1 of the third cell string CS3. As a result, a threshold voltage of the first string selection transistor SST1 of the third cell string CS3 may be increased to the second threshold voltage Vth2 greater than the first threshold voltage Vth1 of the first string selection transistors SST1 of the first and second cell strings CS1 and CS2.

In the fourth operation S240, electrical connection between a corresponding bit line and the first to third cell strings CS1 to CS3 may be controlled by the lower, middle, and upper string selection lines LSSL0, MSSL0, and USSL0.

According to some example embodiments of inventive concepts, a plurality of cell strings may share one bit line and one string selection line, and thus an integration density of the 3D semiconductor memory device may be improved. In addition, at least one of the cell strings may include the string selection transistors having different threshold voltages, and thus a selected bit line may be selectively connected to one of the plurality of cell strings.

While some example embodiments of inventive concepts have been described, it will be apparent to those skilled in the art that various changes and modifications may be made without departing from the spirits and scopes of inventive concepts. Therefore, it should be understood that the above embodiments are not limiting, but illustrative. Thus, the scope of inventive concepts may be determined by the broadest permissible interpretation of the following claims and their equivalents, and shall not be restricted or limited by the foregoing description.

What is claimed is:

1. A three-dimensional (3D) semiconductor memory device comprising:
    a substrate;
    an electrode structure extending in a first direction on the substrate, the electrode structure including a plurality of cell electrodes vertically stacked on the substrate;
    a lower string selection electrode and an upper string selection electrode sequentially stacked on the electrode structure;
    a first vertical structure penetrating the lower string selection electrodes, the upper string selection electrodes, and the electrode structure;
    a second vertical structure spaced apart from the upper string selection electrode such that the second vertical structure does not extend through the upper string selection electrode, the second vertical structure penetrating the lower string selection electrode and the electrode structure; and
    a first bit line extending in a second direction different than the first direction, the first bit line intersecting the electrode structure, the first bit line connected in common to the first vertical structure and the second vertical structure.

2. The 3D semiconductor memory device of claim 1, wherein
    each of the first vertical structure and the second vertical structure include a vertical semiconductor pattern vertical to a top surface of the substrate, and a vertical insulating pattern surrounding the vertical semiconductor pattern, and
    the vertical insulating pattern includes a charge storage layer.

3. The 3D semiconductor memory device of claim 1, further comprising:
    common source regions spaced apart from each other in the substrate and extending in the first direction, wherein
    the electrode structure is disposed on the substrate between two of the common source regions that are adjacent to each other.

4. The 3D semiconductor memory device of claim 1, further comprising:
    a third vertical structure penetrating the electrode structure, the lower string selection electrode, and the upper string selection electrode;
    a fourth vertical structure spaced apart from the upper string selection electrode such that the fourth vertical structure does not penetrate the upper string selection electrode, the fourth vertical structure penetrating the lower string selection electrode and the electrode structure; and
    a second bit line intersecting the electrode structure and extending in the second direction, the second bit line connected in common to the third vertical structure and the fourth vertical structure.

5. The 3D semiconductor memory device of claim 1, wherein
    the lower string selection electrode has a first width in the second direction, and
    the upper string selection electrode has a second width smaller than the first width in the second direction.

6. The 3D semiconductor memory device of claim 5, wherein each of the cell electrodes has a width substantially equal to the first width of the lower string selection electrode.

7. The 3D semiconductor memory device of claim 5, wherein a width of the first bit line is smaller than half of a width of a top surface of each of the first vertical structure and the second vertical structure.

8. The 3D semiconductor memory device of claim 1, wherein
    the lower string selection electrode includes a first lower string selection electrode and a second lower string selection electrode laterally spaced apart from each other,
    the upper string selection electrode includes a first upper string selection electrode and a second upper string selection electrode that are laterally spaced apart from each other,
    the first vertical structure penetrates the first lower string selection electrode and the first upper string selection electrode,
    the second vertical structure is spaced apart from the first upper string selection electrode and the second upper string selection electrodes, and
    the second vertical structure penetrates one of the first lower string selection electrode and the second lower string selection electrode.

9. The 3D semiconductor memory device of claim 8, further comprising:
    a third vertical structure penetrating the second lower string selection electrode, the second upper string selection electrode, and the electrode structure; and
    a fourth vertical structure spaced apart from the first upper string selection electrode and the second upper string selection electrode, and the fourth vertical structure penetrating an other of the first lower string selection electrode and the second lower string selection electrode wherein,
    the first bit line is connected in common to the third vertical structure and the fourth vertical structure.

10. The 3D semiconductor memory device of claim 8, further comprising:
    a plurality of first vertical structures respectively penetrating the first upper string selection electrode and the second upper string selection electrode; and
    a plurality of second vertical structures respectively penetrating the first upper string selection electrode and the second lower string selection electrode, wherein
    the plurality of first vertical structures include the first vertical structure, and
    the plurality of second vertical structures include the second vertical structure.

11. The 3D semiconductor memory device of claim 8, wherein a width of the first bit line is greater than a half of a width of a top surface of each of the first vertical structure and the second vertical structure.

* * * * *